United States Patent
Hayashi

(10) Patent No.: US 11,307,501 B2
(45) Date of Patent: Apr. 19, 2022

(54) EXTREME ULTRAVIOLET LIGHT GENERATING APPARATUS, EXTREME ULTRAVIOLET LIGHT GENERATING METHOD, AND ELECTRONIC DEVICE MANUFACTURING METHOD

(71) Applicant: Gigaphoton Inc., Tochigi (JP)

(72) Inventor: Kengo Hayashi, Oyama (JP)

(73) Assignee: Gigaphoton Inc., Tochigi (JP)

( * ) Notice: Subject to any disclaimer, the term of this patent is extended or adjusted under 35 U.S.C. 154(b) by 0 days.

(21) Appl. No.: 17/089,289

(22) Filed: Nov. 4, 2020

(65) Prior Publication Data

US 2021/0072646 A1 Mar. 11, 2021

Related U.S. Application Data

(63) Continuation of application No. PCT/JP2018/024902, filed on Jun. 29, 2018.

(51) Int. Cl.
*G03F 7/20* (2006.01)
*H05G 2/00* (2006.01)

(52) U.S. Cl.
CPC ........ *G03F 7/7055* (2013.01); *G03F 7/70025* (2013.01); *G03F 7/70033* (2013.01); *H05G 2/006* (2013.01); *H05G 2/008* (2013.01)

(58) Field of Classification Search
CPC ............ G03F 7/7055; G03F 7/70025; G03F 7/70033; H05G 2/006; H05G 2/008
See application file for complete search history.

(56) References Cited

U.S. PATENT DOCUMENTS

| 2003/0178140 A1 | 9/2003 | Hanazaki et al. |
| 2012/0241650 A1 | 9/2012 | Yabu et al. |
| 2018/0007770 A1 | 1/2018 | Ishihara et al. |

FOREIGN PATENT DOCUMENTS

| JP | H01-205581 A | 8/1989 |
| JP | 2012-212655 A | 11/2012 |
| JP | 2014-109232 A | 6/2014 |
| WO | 2016/175031 A1 | 11/2016 |

OTHER PUBLICATIONS

International Search Report issued in PCT/JP2018/024902; dated Sep. 18, 2018.
Written Opinion issued in PCT/JP2018/024902; dated Sep. 18, 2018.
An Office Action; "Notification of Reasons for Refusal", mailed by the Japanese Patent Office dated Dec. 10, 2021, which corresponds to Japanese Patent Application No. 2020-527148 and is related to U.S. Appl. No. 17/089,289; with English language translation.

*Primary Examiner* — Nicole M Ippolito
*Assistant Examiner* — Hanway Chang
(74) *Attorney, Agent, or Firm* — Studebaker & Brackett PC

(57) ABSTRACT

An extreme ultraviolet light generating apparatus for generating extreme ultraviolet light in a chamber according to one aspect of the present disclosure includes a piezoelectric element provided in the chamber; a pressure sensor configured to detect pressure in the chamber; a gas introducing unit configured to introduce gas into the chamber; an exhaust unit configured to exhaust the gas from the chamber; and a control unit configured to control application of a voltage to the piezoelectric element. The control unit is configured to determine whether or not to apply a voltage to the piezoelectric element based on information on the pressure in the chamber obtained by the pressure sensor.

15 Claims, 12 Drawing Sheets

EXTREME ULTRAVIOLET LIGHT GENERATING APPARATUS, EXTREME ULTRAVIOLET LIGHT GENERATING METHOD, AND ELECTRONIC DEVICE MANUFACTURING METHOD

CROSS-REFERENCE TO RELATED APPLICATIONS

The present application is a continuation application of International Application No. PCT/JP2018/024902, filed on Jun. 29, 2018, the entire contents of which are hereby incorporated by reference.

BACKGROUND

1. Technical Field

The present disclosure relates to an extreme ultraviolet light generating apparatus, an extreme ultraviolet light generating method, and an electronic device manufacturing method.

2. Related Art

Recently, miniaturization of semiconductor processes has involved rapidly increasing miniaturization of transfer patterns for use in photolithography of the semiconductor processes. In the next generation, microfabrication at 20 nm or less will be required. Thus, development of an exposure apparatus is expected including a combination of an apparatus for generating extreme ultraviolet (EUV) light having a wavelength of about 13 nm and reduced projection reflection optics.

Three types of EUV light generating apparatuses have been proposed: a laser produced plasma (LPP) apparatus using plasma generated by irradiating a target substance with a laser beam, a discharge produced plasma (DPP) apparatus using plasma generated by electric discharge, and a synchrotron radiation (SR) apparatus using synchrotron radiation light.

LIST OF DOCUMENTS

Patent Documents

Patent Document 1: US Published Patent Application No. 2012/0241650
Patent Document 2: Japanese Patent Laid-Open No. 2014-109232
Patent Document 3: US Published Patent Application No. 2003/0178140

SUMMARY

An extreme ultraviolet light generating apparatus for generating extreme ultraviolet light in a chamber according to one aspect of the present disclosure includes a piezoelectric element provided in the chamber; a pressure sensor configured to detect pressure in the chamber; a gas introducing unit configured to introduce gas into the chamber; an exhaust unit configured to exhaust the gas from the chamber; and a control unit configured to control application of a voltage to the piezoelectric element. The control unit is configured to determine whether or not to apply a voltage to the piezoelectric element based on information on the pressure in the chamber obtained by the pressure sensor.

An extreme ultraviolet light generating method for generating extreme ultraviolet light in a chamber according to another aspect of the present disclosure includes a pressure obtaining step of obtaining information on pressure in the chamber; a gas introducing step of introducing gas into the chamber; an exhausting step of exhausting the gas from the chamber; and a controlling step of switching between application and non-application of a voltage to a piezoelectric element provided in the chamber. The controlling step includes determining whether or not to apply a voltage to the piezoelectric element provided in the chamber based on the information on the pressure in the chamber obtained in the pressure obtaining step.

An electronic device manufacturing method according to a further aspect of the present disclosure includes irradiating a target substance supplied into a chamber with a laser beam introduced into the chamber to generate plasma from which extreme ultraviolet light is generated, with an extreme ultraviolet light generating apparatus. The extreme ultraviolet light generating apparatus includes the chamber, a piezoelectric element provided in the chamber, a pressure sensor configured to detect pressure in the chamber, a gas introducing unit configured to introduce gas into the chamber, an exhaust unit configured to exhaust the gas from the chamber, and a control unit configured to control application of a voltage to the piezoelectric element, the control unit being configured to determine whether or not to apply a voltage to the piezoelectric element based on information on the pressure in the chamber obtained by the pressure sensor. The method further includes outputting the extreme ultraviolet light to an exposure apparatus; and exposing the extreme ultraviolet light onto a photosensitive substrate within the exposure apparatus.

DESCRIPTION OF EMBODIMENTS

Figure 1:
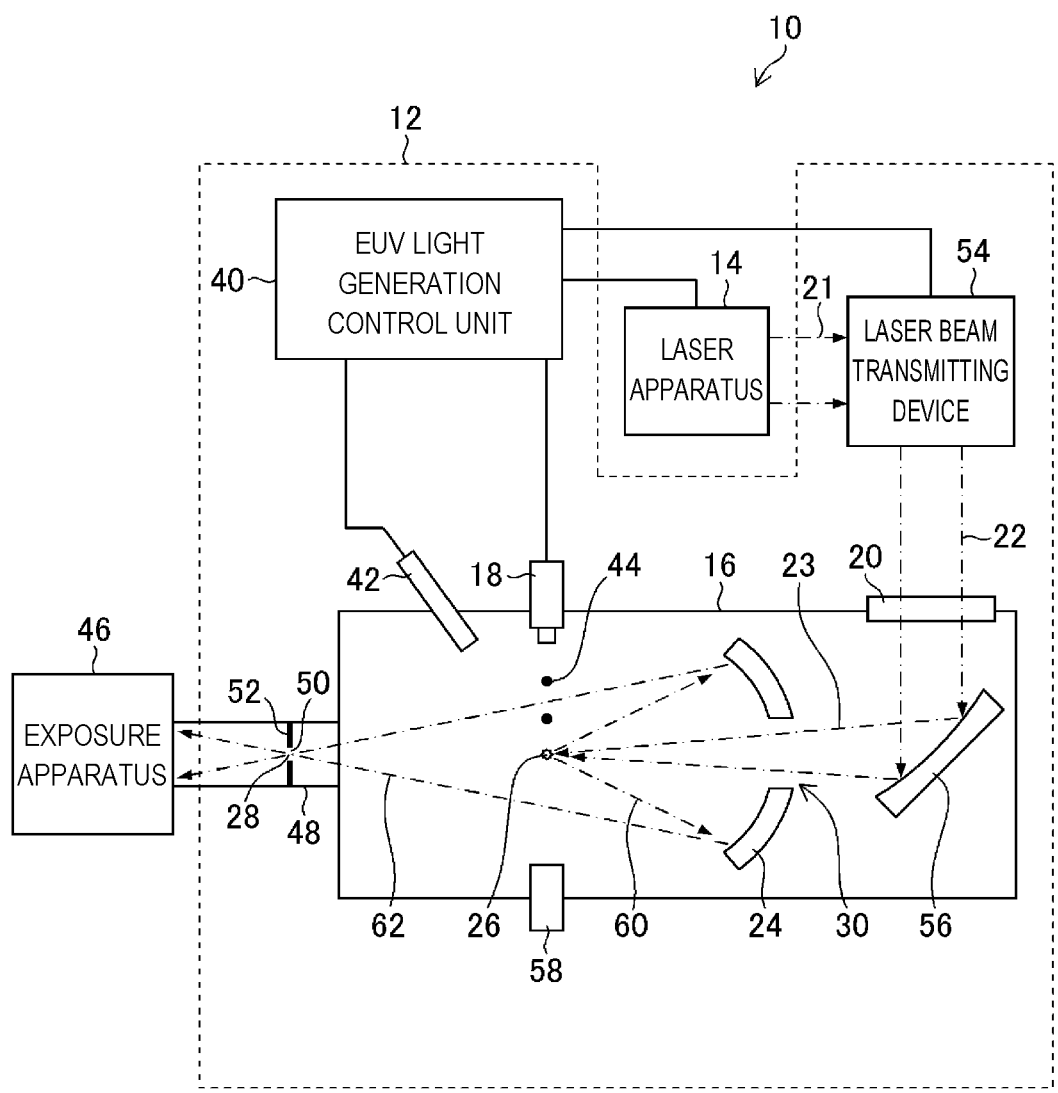
FIG. 1 schematically shows a configuration of an exemplary LPP EUV light generating system.

<Contents>
1. Overall description of extreme ultraviolet light generating system
   1.1 Configuration
   1.2 Operation
2. Terms
3. EUV light generating apparatus
   3.1 Configuration
   3.2 Operation
   3.3 Configuration of EUV light generating apparatus including ion catcher
   3.4 Magnet
   3.5 Operation of ion catcher
4. Piezoelectric element
   4.1 Configuration of piezoelectric element used in piezoelectric actuator
   4.2 Operation of piezoelectric element used in piezoelectric actuator
   4.3 Configuration of vibrating piezoelectric element
   4.4 Operation of vibrating piezoelectric element
5. Preparation for operation and preparation for maintenance of chamber
   5.1 Processing of preparation for operation of chamber
   5.2 Processing of preparation for maintenance of chamber
6. Problem
7. Embodiment 1
   7.1 Configuration
   7.2 Operation
   7.3 Effect
8. Embodiment 2
   8.1 Configuration
   8.2 Operation
   8.3 Effect
9. Combination of embodiments
10. Exemplary electronic device manufacturing method using EUV light generating apparatus Now, with reference to the drawings, embodiments of the present disclosure will be described in detail. The embodiments described below illustrate some examples of the present disclosure, and do not limit contents of the present disclosure. Also, all configurations and operations described in the embodiments are not necessarily essential as configurations and operations of the present disclosure. The same components are denoted by the same reference numerals, and overlapping descriptions are omitted.

1. Overall Description of Extreme Ultraviolet Light Generating System

1.1 Configuration

FIG. 1 schematically shows a configuration of an exemplary LPP EUV light generating system 10. An EUV light generating apparatus 12 is used together with at least one laser apparatus 14. In the present disclosure, a system including the EUV light generating apparatus 12 and the laser apparatus 14 is referred to as the EUV light generating system 10. The EUV light generating apparatus 12 includes a chamber 16 and a target supply unit 18.

The chamber 16 is a sealable container. The target supply unit 18 supplies a target substance into the chamber 16, and is, for example, mounted to extend through a wall of the chamber 16. A material of the target substance may include tin, terbium, gadolinium, lithium, xenon, or any combinations of two or more thereof, but is not limited thereto.

The wall of the chamber 16 has at least one through hole. The through hole is blocked by a window 20 through which a pulse laser beam 22 output from the laser apparatus 14 passes. Inside the chamber 16, for example, an EUV light condensing mirror 24 having a spheroidal reflective surface is arranged. The EUV light condensing mirror 24 has first and second focal points. On a surface of the EUV light condensing mirror 24, a multilayer reflective film including, for example, alternately stacked molybdenum and silicon is formed. The EUV light condensing mirror 24 is arranged such that, for example, the first focal point is located in a plasma generating region 26 and the second focal point is located at an intermediate focusing point (IF) 28. A through-hole 30 is provided at a center of the EUV light condensing mirror 24, and a pulse laser beam 23 passes through the through-hole 30.

The EUV light generating apparatus 12 includes an EUV light generation control unit 40, a target sensor 42, and the like. The target sensor 42 detects one or several of presence, a trajectory, a position, and a speed of a target 44. The target sensor 42 may have an imaging function.

The EUV light generating apparatus 12 includes a connecting portion 48. The connecting portion 48 provides communication between an inside of the chamber 16 and an inside of an exposure apparatus 46. The connecting portion 48 includes therein a wall 52 having an aperture 50. The wall 52 is arranged such that the aperture 50 is located at the second focal point of the EUV light condensing mirror 24.

The EUV light generating apparatus 12 further includes a laser beam transmitting device 54, a laser beam condensing mirror 56, a target collecting unit 58, and the like. The laser beam transmitting device 54 includes an optical element and an actuator. The optical element defines a transmission state of a laser beam. The actuator adjusts a position, an orientation, and the like of the optical element. The target collecting unit 58 collects the target 44. The target collecting unit 58 is arranged on an extended line in a traveling direction of the target 44 output into the chamber 16.

The laser apparatus 14 may be a master oscillator power amplifier (MOPA) system. The laser apparatus 14 may include a master oscillator (not shown), an optical isolator (not shown), and a $CO_2$ laser amplifier (not shown). The laser apparatus 14 may include a plurality of $CO_2$ laser amplifiers. A wavelength of a laser beam output from the master oscillator is, for example, 10.59 μm, and a repetition frequency of pulse oscillation is, for example, 100 kHz.

1.2 Operation

With reference to FIG. 1, operation of the exemplary LPP EUV light generating system 10 will be described. The inside of the chamber 16 is maintained at pressure lower than atmospheric pressure, and may be preferably vacuum. Alternatively, gas having high EUV light transmittance exists in the chamber 16. The gas existing in the chamber 16 may be, for example, hydrogen gas.

A pulse laser beam 21 output from the laser apparatus 14 passes through the laser beam transmitting device 54, and enters, as the pulse laser beam 22, the chamber 16 through the window 20. The pulse laser beam 22 travels along at least one laser beam path in the chamber 16, and is reflected by the laser beam condensing mirror 56 and applied to the at least one target 44 as the pulse laser beam 23.

The target supply unit 18 outputs the target 44 made of the target substance toward the plasma generating region 26 in the chamber 16. The target supply unit 18 forms droplets by, for example, a continuous jet scheme. In the continuous jet scheme, a nozzle is vibrated to provide periodic vibration to a flow of the target substance ejected in a jet form through a nozzle hole, thereby periodically separating the target substance. The separated target substance can form a free interface by its own surface tension, thereby forming a droplet.

The target 44 is irradiated with at least one pulse included in the pulse laser beam 23. Plasma is generated from the target 44 irradiated with the pulse laser beam 23, and radiates radiation light 60. EUV light 62 included in the radiation light 60 is selectively reflected by the EUV light condensing mirror 24. The EUV light 62 reflected by the EUV light condensing mirror 24 is focused at the intermediate focusing point 28 and output to the exposure apparatus 46. A single target 44 may be irradiated with a plurality of pulses included in the pulse laser beam 23.

The EUV light generation control unit 40 collectively controls the entire EUV light generating system 10. The EUV light generation control unit 40 processes a detection result from the target sensor 42. The EUV light generation control unit 40 controls, for example, output timing of the target 44, an output direction of the target 44, and the like based on the detection result from the target sensor 42. Further, the EUV light generation control unit 40 controls, for example, oscillation timing of the laser apparatus 14, a traveling direction of the pulse laser beam 22, a focusing position of the pulse laser beam 23, and the like. Such various kinds of control are merely exemplary, and different control may be added as required.

2. Terms

"Target" is an object irradiated with a laser beam introduced into the chamber. Plasma is generated from the target irradiated with the laser beam and radiates EUV light. The target is a plasma generating source.

"Droplet" is a form of a target supplied into the chamber. The droplet may be the target in a form of droplet having a substantially spherical shape by surface tension of a melted target substance. "Droplet trajectory" is a path on which a droplet travels in the chamber.

"Pulse laser beam" may be a laser beam including a plurality of pulses. "Laser beam" is not limited to a pulse laser beam but may be a laser beam in general. "Laser beam path" is an optical path of a laser beam.

"Plasma light" is radiation light radiated from plasma of a target. This radiation light includes EUV light.

"EUV light" stands for "extreme ultraviolet light". "Extreme ultraviolet light generating apparatus" is also referred to as "EUV light generating apparatus".

"Piezoelectric element" is synonymous with a dielectric element. A piezoelectric element used as a vibrating element for vibrating a liquid target substance to generate a droplet is referred to as "vibrating piezoelectric element" in some cases.

"Piezoelectric actuator" is an actuator using a piezoelectric element as a drive source.

"Servo-on" includes a state in which a voltage is applied to the piezoelectric actuator for achieving a desired operation of the piezoelectric actuator. For example, the state in which a voltage is applied to the piezoelectric actuator may be referred to as "servo-on" and a state in which the voltage to the piezoelectric actuator is interrupted may be referred to as "servo-off". When a voltage value range for achieving the desired operation of the piezoelectric actuator is defined, a state in which a voltage equal to or higher than a defined value is applied to the piezoelectric actuator may be referred to as "servo-on", and a state in which a voltage lower than the defined value is applied to the piezoelectric actuator may be referred to as "servo-off".

"Application of voltage" may include switching from non-supply to supply of a voltage to the piezoelectric actuator by control with a controller between a power source device and the piezoelectric actuator in an operation state of the power source device.

"Non-application of voltage" may include switching from supply to non-supply of a voltage to the piezoelectric actuator by control with the controller between the power source device and the piezoelectric actuator in the operation state of the power source device. "Application of voltage" may include a voltage increase from a voltage lower than a defined value to a voltage equal to or higher than the defined value, and "non-application of voltage" may include a voltage reduction from a voltage equal to or higher than the defined value to a voltage lower than the defined value.

"Application of voltage" and "non-application of voltage" may be applied to the vibrating piezoelectric element as well.

3. EUV Light Generating Apparatus

3.1 Configuration

Figure 2:
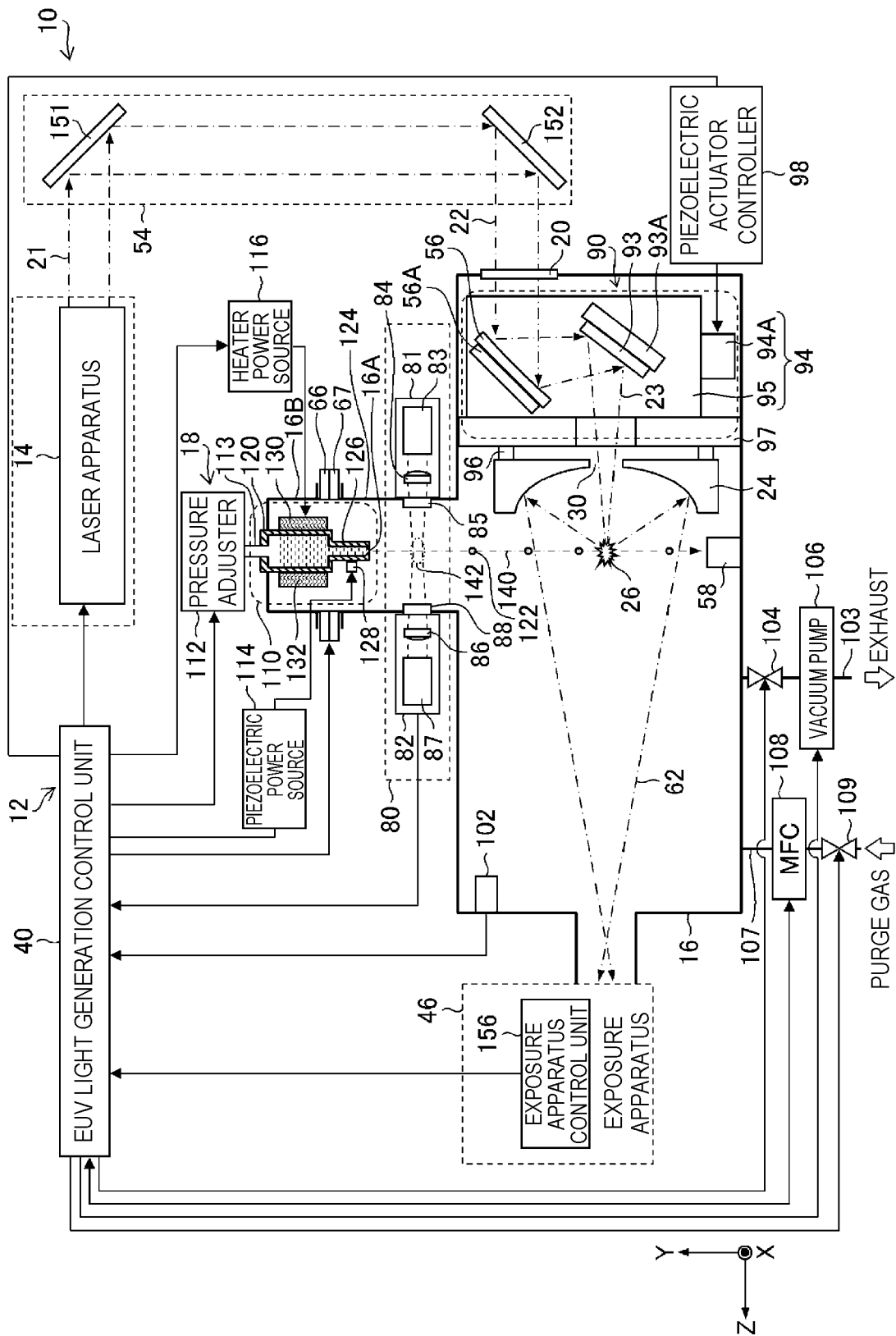
FIG. 2 schematically shows a configuration of an exemplary LPP EUV light generating apparatus.
Figure 3:
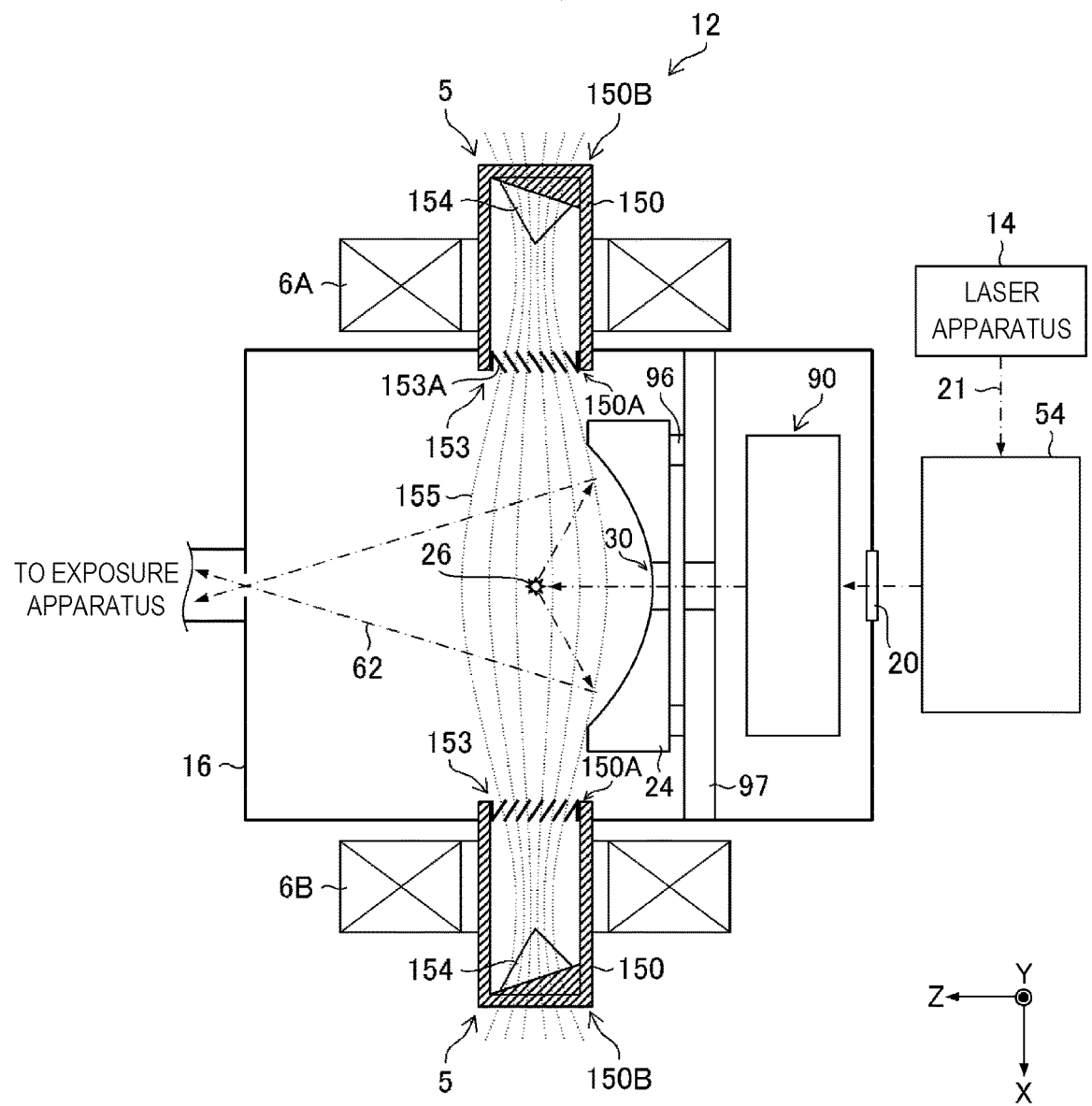
FIG. 3 schematically shows a configuration of an EUV light generating apparatus including an ion catcher.

FIG. 2 schematically shows a configuration of an EUV light generating apparatus. For the purpose of description related to directions, an XYZ orthogonal coordinate axis is introduced in FIG. 2. A direction of a Z axis is defined to be a direction in which EUV light is guided from the chamber 16 toward the exposure apparatus 46. An X axis and a Y axis are orthogonal to the Z axis and orthogonal to each other. A direction of the Y axis is defined to be a direction of a center axis of a nozzle 126 from which the target substance is output. The direction of the Y axis is a trajectory direction of a droplet. A direction of the X axis is defined to be a direction orthogonal to the sheet of FIG. 2. FIG. 3 and the following drawings also include the coordinate axis introduced in FIG. 2.

The EUV light generating apparatus 12 includes the chamber 16, the laser beam transmitting device 54, and the EUV light generation control unit 40. The EUV light generating apparatus 12 may include the laser apparatus 14.

The chamber 16 includes the target supply unit 18, a stage 66, a timing sensor 80, the window 20, a laser beam condensing optical system 90, the EUV light condensing mirror 24, the target collecting unit 58, and a pressure sensor 102.

The target supply unit 18 includes a droplet generator 110, a pressure adjuster 112, a piezoelectric power source 114, and a heater power source 116. The pressure adjuster 112, the piezoelectric power source 114, and the heater power source 116 are connected to the EUV light generation control unit 40.

The droplet generator 110 includes a tank 120, a nozzle 126, a vibrating piezoelectric element 128, and a heater 130. The tank 120 holds the target substance. The nozzle 126 has a nozzle hole 124. The nozzle hole 124 outputs a droplet 122 of the target substance. The vibrating piezoelectric element 128 is arranged near the nozzle 126. The vibrating piezoelectric element 128 is an example of "piezoelectric element provided in the chamber" in the present disclosure. The heater 130 is arranged on an outer side surface of the tank 120.

The target substance is, for example, tin (Sn). At least an inside of the tank 120 is made of a material less reactive with the target substance. The material less reactive with tin as an example of the target substance may include, for example, silicon carbide (SiC), silicon dioxide ($SiO_2$), aluminum oxide ($Al_2O_3$), molybdenum (Mo), tungsten (W), and tantalum (Ta).

The pressure adjuster 112 is connected through a pipe line 113 to the tank 120. The pressure adjuster 112 is arranged on a pipe between an inert gas introducing unit (not shown) and the tank 120. The inert gas introducing unit may include a gas tank filled with inert gas such as helium or argon. The inert gas introducing unit may introduce inert gas into the tank 120 through the pressure adjuster 112. The pressure adjuster 112 may be connected to an exhaust pump (not shown). The pressure adjuster 112 includes an electromagnetic valve (not shown), a pressure sensor (not shown), and the like for introducing and exhausting gas. The pressure adjuster 112 can use the pressure sensor (not shown) to detect pressure in the tank 120. The pressure adjuster 112 can operate the exhaust pump (not shown) to exhaust gas from the tank 120.

The pressure adjuster 112 outputs a detection signal of detected pressure to the EUV light generation control unit 40. The EUV light generation control unit 40 supplies, to the pressure adjuster 112, a control signal for controlling operation of the pressure adjuster 112 such that the pressure in the tank 120 reaches target pressure, in accordance with the detection signal output from the pressure adjuster 112. The piezoelectric power source 114 is connected to the vibrating piezoelectric element 128. The heater power source 116 is connected to the heater 130.

The stage 66 moves the droplet generator 110 to a specified position at least on an X-Z plane in accordance with an instruction from the EUV light generation control unit 40.

The chamber 16 includes a first container 16A and a second container 16B. The second container 16B communicates with the first container 16A, and is coupled to the first container 16A via the stage 66 and a support plate 67. The second container 16B is fixed to the stage 66.

The droplet generator 110 is fixed to the second container 16B. Specifically, the droplet generator 110 is fixed to the stage 66 via the second container 16B.

The support plate 67 is fixed to the first container 16A. The stage 66 is movable at least within the X-Z plane on the support plate 67. The first container 16A fixed to the support plate 67 is a stationary container fixedly arranged at a predetermined position. The second container 16B fixed to the stage 66 is a movable container movable on the support plate 67. The stage 66 can move on the support plate 67 to move the droplet generator 110 to the position specified by the EUV light generation control unit 40.

The timing sensor 80 includes a light source unit 81 and a light receiving unit 82. The light source unit 81 and the light receiving unit 82 are arranged to face each other with a droplet trajectory 140 as a traveling path of the droplet 122 therebetween.

The light source unit 81 includes a light source 83 and an illumination optical system 84. The light source unit 81 is arranged to illuminate a droplet at a detection region 142 on the droplet trajectory 140 between the nozzle hole 124 of the droplet generator 110 and the plasma generating region 26.

The light source 83 may be a laser light source of monochromatic light or a lamp that emits a plurality of wavelengths. The light source 83 may include an optical fiber, which is connected to the illumination optical system 84. The illumination optical system 84 includes a light condensing lens. The illumination optical system 84 includes a window 85. The window 85 is arranged on a wall of the chamber 16.

The light receiving unit 82 includes a light receiving optical system 86 and an optical sensor 87. The light receiving unit 82 is arranged to receive illumination light that is at least part of illumination light output from the light source unit 81 and has passed through the detection region 142. The light receiving optical system 86 includes a light condensing lens. The light receiving optical system 86 includes a window 88. The window 88 is arranged on the wall of the chamber 16.

The optical sensor 87 includes one or more light receiving surfaces. The optical sensor 87 may be any of a photodiode, a photodiode array, an avalanche photodiode, a photomultiplier, a multi-pixel photon counter, and an image intensifier. The optical sensor 87 outputs an electric signal in accordance with a light receiving amount.

The window 85 of the light source unit 81 and the window 88 of the light receiving unit 82 are arranged to face each other with the droplet trajectory 140 therebetween. The light source unit 81 and the light receiving unit 82 may face each other in a direction orthogonal to the droplet trajectory 140 or in a direction not orthogonal to the droplet trajectory 140. The timing sensor 80 is an example of the target sensor 42 shown in FIG. 1.

The laser beam transmitting device 54 includes a first high reflective mirror 151 and a second high reflective mirror 152 as optical elements for defining a traveling direction of a laser beam.

The laser beam condensing optical system 90 is arranged to receive the pulse laser beam 22 output from the laser beam transmitting device 54. The laser beam condensing optical system 90 focuses, in the plasma generating region 26, the pulse laser beam 23 having entered the chamber 16 through the window 20. The laser beam condensing optical system 90 includes the laser beam condensing mirror 56, a high reflective plane mirror 93, and a laser beam manipulator 94. The laser beam condensing optical system 90 is an example of "laser beam condensing optical unit" in the present disclosure.

The laser beam condensing mirror 56 is, for example, a high reflective off-axis parabolic mirror. The laser beam condensing mirror 56 is held by a mirror holder 56A. The mirror holder 56A is fixed to a plate 95. The high reflective plane mirror 93 is held by a mirror holder 93A. The mirror holder 93A is fixed to the plate 95.

The laser beam manipulator 94 uses, for example, a stage that can move the plate 95 in the three directions of the X axis, the Y axis, and the Z axis orthogonal to each other. The laser beam manipulator 94 can move a laser applying position in the chamber 16 in the directions of the X axis, the Y axis, and the Z axis to the position specified by the EUV light generation control unit 40. The laser beam manipulator 94 includes a piezoelectric actuator 94A as a drive source of the stage. The piezoelectric actuator 94A is connected to a piezoelectric actuator controller 98.

The EUV light condensing mirror 24 is held by an EUV light condensing mirror holder 96. The EUV light condensing mirror holder 96 is fixed to a plate 97. The plate 97 holds the laser beam condensing optical system 90 and the EUV light condensing mirror 24. The plate 97 is fixed to an inner wall of the chamber 16.

The chamber 16 is connected to an exhaust channel 103 through an outlet (not shown). The exhaust channel 103 includes an exhaust valve 104 and a vacuum pump 106. The chamber 16 is connected to a gas introducing channel 107 through a gas inlet (not shown). The gas introducing channel 107 includes a mass flow controller (MFC) 108 and an introducing valve 109. The gas introducing channel 107 is connected to a gas introducing source (not shown). Purge gas shown in FIG. 2 is a general term of gas introduced into the chamber 16 during purging. The purge gas may include, for example, argon gas (Ar gas), nitrogen gas ($N_2$ gas), and the like.

The EUV light generation control unit 40 is connected to the stage 66, the timing sensor 80, and the piezoelectric actuator controller 98. Further, the EUV light generation control unit 40 is connected to the pressure sensor 102, the exhaust valve 104, the vacuum pump 106, the mass flow controller 108, the introducing valve 109, and an exposure apparatus control unit 156. The exposure apparatus control unit 156 controls the exposure apparatus 46. The exposure apparatus control unit 156 may be included in the exposure apparatus 46.

A control device such as the EUV light generation control unit 40 and a processing unit can be achieved by hardware and software combination of one or more computers. The computers can include a central processing unit (CPU) and a memory. The software is synonymous with a computer program. The computers conceptually include a programmable controller.

Part or all of processing functions of the control device such as the EUV light generation control unit 40 may be achieved by an integrated circuit typified by a field programmable gate array (FPGA). An application specific integrated circuit (ASIC) may be used in place of or in combination with the FPGA.

The functions of the plurality of control devices can be achieved by a single control device. Further, the control devices may be connected to each other through a communication network such as a local area network or the Internet. In a distributed computing environment, a program unit may be stored in both local and remote memory storage devices.

3.2 Operation

With reference to FIG. 2, operation of the exemplary EUV light generating apparatus 12 will be described. The EUV light generation control unit 40 controls the exhaust valve 104 and the vacuum pump 106 such that the inside of the chamber 16 is vacuum. The EUV light generation control unit 40 controls, in accordance with a detection value of the pressure sensor 102, exhaust of gas from the chamber 16 such that the pressure in the chamber 16 is within a predetermined range. The EUV light generation control unit 40 controls, in accordance with a detection value of the pressure sensor 102, introduction of gas into the chamber 16 such that the pressure in the chamber 16 is within the predetermined range.

The EUV light generation control unit 40 controls opening and closing of the exhaust valve 104 and a rotation speed of the vacuum pump 106, and exhausts gas from the chamber 16 until the pressure in the chamber 16 reaches predetermined pressure or lower. The EUV light generation control unit 40 controls operation of the mass flow controller 108 and opening and closing of the vacuum pump 106, and introduces gas into the chamber 16 until the pressure in the chamber 16 reaches the predetermined pressure or higher. The predetermined pressure may be, for example, 1 pascal [Pa].

The exhaust valve 104 and the vacuum pump 106 are examples of components of "exhaust unit configured to exhaust the gas from the chamber" in the present disclosure. The mass flow controller 108 and the introducing valve 109 are examples of components of "gas introducing unit configured to introduce gas into the chamber" in the present disclosure. The gas introducing unit may include a gas introducing source.

The EUV light generation control unit 40 also drives the heater 130 via the heater power source 116, and performs control to heat and maintain the target substance in the tank 120 to and at a predetermined temperature equal to or higher than a melting point while monitoring a temperature using a temperature sensor (not shown). When the target substance is tin, the predetermined temperature may be, for example, in the range of 250° C. to 290° C. Tin, which has a melting point of 232° C., as the target substance held in the tank 120 is heated by the heater 130 and melts into liquid. The melted tin is an example of "target substance in a liquid form" in the present disclosure.

To discharge the liquid target substance through the nozzle hole 124, the EUV light generation control unit 40 controls the pressure adjuster 112 such that the pressure in the tank 120 reaches predetermined pressure. The predetermined pressure in the tank 120 may be, for example, 3 megapascals [MPa] or higher.

The pressure adjuster 112 can increase or decrease the pressure in the tank 120 by introducing gas into the tank 120 or exhausting gas from the tank 120 in accordance with a control signal from the EUV light generation control unit 40. The pressure adjuster 112 adjusts the pressure in the tank 120 to a target pressure value. The gas introduced into the tank 120 is preferably inert gas.

The pressure adjuster 112 adjusts, in accordance with an instruction from the EUV light generation control unit 40, the pressure in the tank 120 to a predetermined value such that the droplet 122 reaches the plasma generating region 26 at a predetermined speed.

The predetermined speed of the droplet may be, for example, in the range of 60 m/s to 120 m/s. The predetermined value of the pressure in the tank 120 may be, for example, in the range of several MPa to 40 MPa. As a result, a jet of the liquid target substance can be ejected at the predetermined speed through the nozzle hole 124.

The EUV light generation control unit 40 supplies a voltage having a predetermined waveform from the piezoelectric power source 114 to the vibrating piezoelectric element 128, and performs duty adjustment such that the liquid target substance output from the nozzle hole 124 regularly generates the droplet 122 at a predetermined piezoelectric drive frequency. The duty adjustment is performed to set a duty value appropriate for generation of the droplet 122.

The EUV light generation control unit 40 supplies a voltage having a predetermined piezoelectric drive frequency and a predetermined duty via the piezoelectric power source 114 to the vibrating piezoelectric element 128 such that the liquid target substance output from the nozzle hole 124 generates the droplet 122. Specifically, the EUV light generation control unit 40 transmits a piezoelectric drive voltage waveform signal to the piezoelectric power source 114.

The piezoelectric power source 114 supplies a voltage to the vibrating piezoelectric element 128 in accordance with an instruction from the EUV light generation control unit 40. When the voltage is applied to the vibrating piezoelectric element 128, the vibrating piezoelectric element 128 is vibrated. The vibration of the vibrating piezoelectric element 128 propagates to the nozzle 126, and the liquid target substance is vibrated through the nozzle hole 124. The jet of the liquid target substance output through the nozzle hole 124 travels while splitting into droplets. In this case, the liquid target substance is regularly vibrated to facilitate connection of the droplets, and the droplets are connected to periodically generate droplets 122 having substantially the same volume. Then, the droplets 122 can be supplied to the plasma generating region 26.

The pulse laser beam output from the laser apparatus 14 is guided to the plasma generating region 26 through the first high reflective mirror 151, the second high reflective mirror 152, and the laser beam condensing optical system 90, and applied to the droplet 122.

The illumination light output from the light source unit 81 to the droplet 122 is received by the light receiving unit 82. The intensity of the light received by the light receiving unit 82 may decrease in synchronization with the droplet 122 passing through the detection region 142. The change in the light intensity is detected by the optical sensor 87. The optical sensor 87 outputs a detection result as a passing timing signal to the EUV light generation control unit 40.

For irradiating the droplet 122 with the pulse laser beam 23, the EUV light generation control unit 40 generates a droplet detection signal indicating passing timing of the droplet at a timing when the passing timing signal exceeds a predetermined threshold voltage. The detection region 142 may be a region in which a droplet detection signal is generated when the droplet 122 passes between the light source unit 81 and the light receiving unit 82.

The EUV light generation control unit 40 generates a light emission trigger signal behind the droplet detection signal by a predetermined delay time. Specifically, the EUV light generation control unit 40 can generate a light emission trigger signal behind the droplet detection signal by a delay time using a delay circuit (not shown). The EUV light generation control unit 40 inputs the light emission trigger signal to the laser apparatus 14.

The delay time of the delay circuit is set such that the light emission trigger signal is input to the laser apparatus 14 before the droplet 122 reaches the plasma generating region 26, the droplet 122 having passed through the detection region 142. In other words, the delay time is set such that the droplet 122 is irradiated with the pulse laser beam output from the laser apparatus 14 when the droplet reaches the plasma generating region 26.

When receiving the light emission trigger signal, the laser apparatus 14 outputs the pulse laser beam 21. The pulse laser beam 21 output from the laser apparatus 14 passes through the laser beam transmitting device 54 and the window 20, and is input to the laser beam condensing optical system 90.

The EUV light generation control unit 40 may control the stage 66 to move the droplet generator 110 such that the droplet 122 passes through the plasma generating region 26.

The EUV light generation control unit 40 controls the piezoelectric actuator 94A such that the pulse laser beam 23 is condensed in the plasma generating region 26. The pulse laser beam 23 is condensed and applied to the droplet 122 in the plasma generating region 26 by the laser beam condensing optical system 90. As such, the pulse laser beam 23 is condensed and applied to the droplet 122, and thus plasma is generated from the target to generate EUV light 62. The pulse laser beam 23 may be condensed and applied to the droplets 122 supplied from the target supply unit 18 to the plasma generating region 26 at predetermined intervals to periodically generate the EUV light 62.

The EUV light 62 generated at the plasma generating region 26 is condensed by the EUV light condensing mirror 24, focused at the intermediate focusing point 28, and then input to the exposure apparatus 46. On the other hand, the droplet 122 having not been irradiated with the pulse laser beam 23 passes through the plasma generating region 26 and enters the target collecting unit 58. The droplet 122 collected by the target collecting unit 58 can be held as a liquid target substance.

There may be a case that the plasma generating region 26 is moved in accordance with an instruction from the exposure apparatus 46. When the plasma generating region 26 is moved in the X-Y plane, the stage 66 changes an output position of the droplet 122, and the piezoelectric actuator 94A changes an applying position of the pulse laser beam 23.

When the plasma generating region 26 is moved in the Y direction, a delay time from the droplet detection signal to the light emission trigger signal is changed. The EUV light generating apparatus 12 shown in FIG. 2 is an example of an apparatus that can implement "extreme ultraviolet light generating method" in the present disclosure.

3.3 Configuration of EUV Light Generating Apparatus Including Ion Catcher

FIG. 3 schematically shows a configuration of an EUV light generating apparatus including an ion catcher. In FIG. 3, components of the laser beam transmitting device 54 and the laser beam condensing optical system 90 are not shown. As shown in FIG. 3, the EUV light generating apparatus 12 includes an ion catcher 5. The ion catcher 5 includes a cylindrical member 150, a first collision part 153, and a second collision part 154. A first end 150A of the cylindrical member 150 is closer to the plasma generating region 26. The first end 150A opens in a direction along a magnetic field 155. The first end 150A includes a first collision part 153.

A second end 150B of the cylindrical member 150 is farther from the plasma generating region 26. The second end 150B includes a second collision part 154.

The first collision part 153 includes a plurality of plate members 153A. The plate members 153A are arranged obliquely at intervals. The plate members 153A each have a collision surface with which ions or neutral particles collide. The second collision part 154 has a conical or pyramidal surface.

The cylindrical member 150 is arranged to extend through bores of coils that constitute a magnet 6A and a magnet 6B. Thus, a strong magnetic field 155 is formed in the cylindrical member 150.

3.4 Magnet

The magnet 6A and the magnet 6B may be electromagnets including coils. The magnet 6A and the magnet 6B are arranged to face each other with the chamber 16 therebetween such that central axes of the coils match. The magnet 6A and the magnet 6B can form a magnetic field in the chamber 16. The magnetic field formed by the magnet 6A and the magnet 6B may be the strongest near the center of the bore of each coil, and may be slightly weaker between the magnet 6A and the magnet 6B.

3.5 Operation of Ion Catcher

When ions or neutral particles collide with any of the collision surfaces of the first collision part 153 and are reflected, it is likely that the first collision part 153 cannot completely collect the ions or the neutral particles but the ions or the neutral particles enter the cylindrical member 150. In this case, the strong magnetic field formed in the cylindrical member 150 reduces the speed of the ions. The speed of the neutral particles is also reduced when the neutral particles are reflected by the first collision part 153. Thus, the ions or the neutral particles are not reflected by the second collision part 154 but tend to adhere to the second collision part 154. Even if reflected by the second collision part 154, the ions or the neutral particles can be less likely to return through the first collision part 153 into the chamber 16 again because of a further reduction in speed. Specifically, the inside of the cylindrical member 150 can serve as a relaxation space for reducing the speed of the ions or the neutral particles, thereby efficiently collecting the ions or the neutral particles.

Ions contained in plasma may receive a Lorentz force perpendicular to both a magnetic field direction and an ion moving direction when trying to diffuse from the plasma generating region 26. By the Lorentz force, a movement trajectory of the ions when viewed in a direction parallel to the magnetic field may be substantially circular. Specifically, the ions may move in a spiral along the magnetic field.

Figure 4:
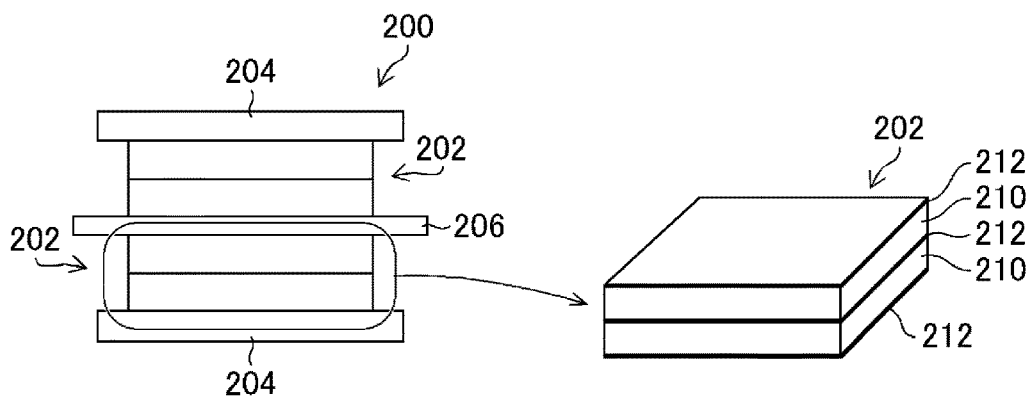
FIG. 4 schematically shows a configuration of a piezoelectric actuator.

4. Piezoelectric Element 4.1 Configuration of Piezoelectric Element Used in Piezoelectric Actuator FIG. 4 schematically shows a configuration of a piezoelectric actuator. A piezoelectric actuator 200 shown in FIG. 4 can be used as the piezoelectric actuator 94A shown in FIG. 2. The piezoelectric actuator 200 includes a piezoelectric element 202, a stator 204, and a movable member 206. In the piezoelectric actuator 200, a plurality of piezoelectric elements 202 are each supported by the stator 204. The piezoelectric elements 202 are coupled to one movable member 206.

The piezoelectric element 202 supported by the stator 204 may operate to expand and contract in a direction of an electric field. The piezoelectric element 202 coupled to the movable member 206 may operate to cause shearing strain perpendicular to the electric field.

The piezoelectric element 202 includes a piezoelectric body 210 held between two electrodes 212. FIG. 4 shows an example of the piezoelectric element 202 as a multilayer piezoelectric element, but the piezoelectric element 202 may be a single-layer piezoelectric element.

4.2 Operation of Piezoelectric Element Used in Piezoelectric Actuator

When a voltage is applied to the electrodes 212, the piezoelectric element 202 shown in FIG. 4 is subjected to flexural deformation. The movable member 206 coupled to the piezoelectric element 202 is moved in response to application of a voltage.

The piezoelectric actuator 200 can apply pressure to the movable member by application of a predetermined voltage, and hold a position of the movable member 206. The piezoelectric actuator 200 can move the movable member 206 in accordance with a change in the voltage applied to the piezoelectric element 202. The piezoelectric element 202 used in the piezoelectric actuator 200 is an example of "piezoelectric element provided in the chamber" in the present disclosure.

4.3 Configuration of Vibrating Piezoelectric Element

Figure 5:
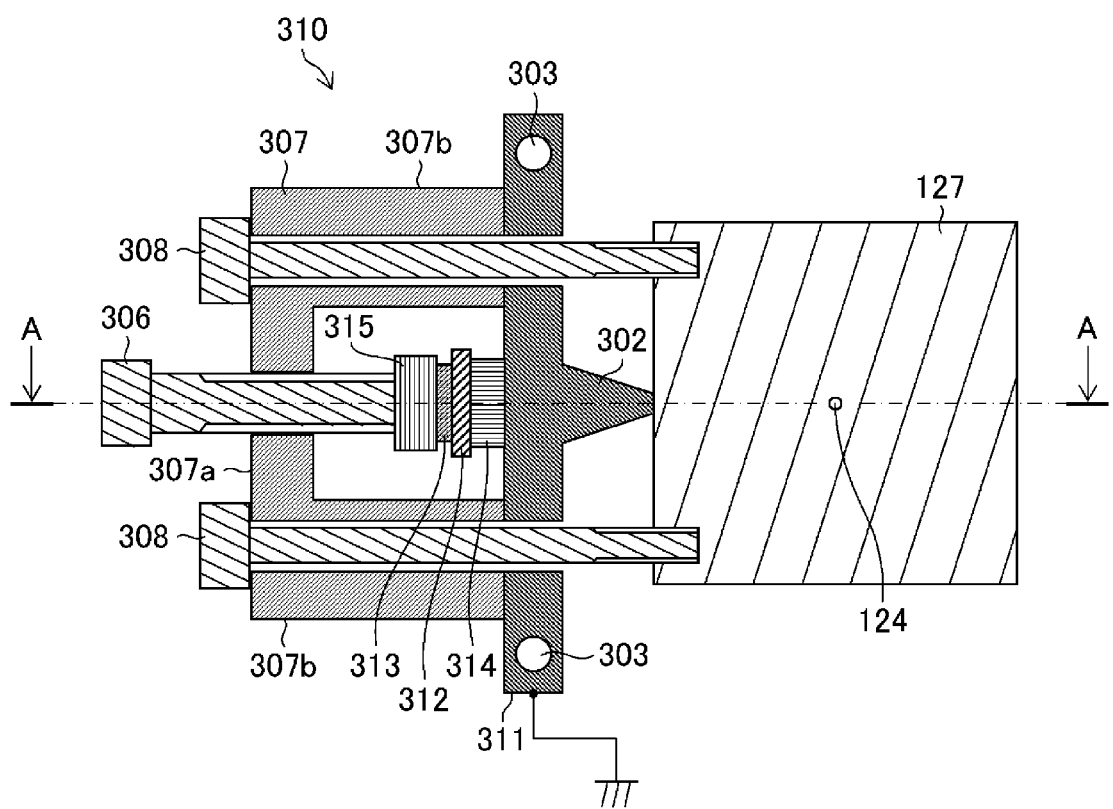
FIG. 5 schematically shows an exemplary configuration of a vibrating unit.

FIG. 5 schematically shows an exemplary configuration of a vibrating unit. FIG. 5 is a cross-sectional view including central axes of two first bolts 308 of a vibrating unit 310, and schematically shows a configuration when the nozzle hole 124 and the vibrating unit 310 are viewed in a target output direction.

The vibrating unit 310 shown in FIG. 5 is an example of a structure for mounting the vibrating piezoelectric element 128 to the nozzle 126 shown in FIG. 2. A nozzle holder 127 shown in FIG. 5 is a member for mounting the nozzle 126 shown in FIG. 2 to the tank 120.

The vibrating unit 310 includes the two first bolts 308, a second bolt 306, a pressurizing frame 307, a retaining member 315, a piezoelectric element 314, and a vibration transmitting member 311. The vibrating unit 310 further includes an electrode 312 and an insulating member 313.

The pressurizing frame 307 is a frame member of the vibrating unit 310. The pressurizing frame 307 includes one arm 307b and the other arm 307b located on opposite sides, and a middle beam 307a connecting the arms 307b.

The vibration transmitting member 311 is arranged between the pressurizing frame 307 and the nozzle holder 127. A truncated conical projection 302 with a narrow tip is provided at a middle of the vibration transmitting member 311. The tip of the projection 302 is in contact with a side surface of the nozzle holder 127.

The two first bolts 308 fix the pressurizing frame 307 and the vibration transmitting member 311 to the side surface of the nozzle holder 127. The second bolt 306 presses, via the retaining member 315, the piezoelectric element 314 and the vibration transmitting member 311 against the nozzle holder 127.

The electrode 312 and the insulating member 313 are arranged between the second bolt 306 and the piezoelectric element 314. In this case, the electrode 312 is in contact with the piezoelectric element 314. The electrode 312 and the second bolt 306 are electrically insulated by the insulating member 313.

The vibration transmitting member 311 may function as an electrode of the piezoelectric element 314, which is paired with the electrode 312. In the vibrating unit 310, any member electrically connected to the vibration transmitting member 311 may be grounded. FIG. 5 shows the vibration transmitting member 311 being grounded.

The electrode 312 is connected to the piezoelectric power source 114 shown in FIG. 2 through a connecting line (not shown). A frequency of a voltage supplied from the piezoelectric power source 114 to the electrode 312 may be lower than a resonance frequency of the piezoelectric element 314.

The piezoelectric element 314 may be a composite piezoelectric element. The composite piezoelectric element is formed by hardening accumulated minute bulk piezoelectric elements with resin. The resonance frequency of the piezoelectric element 314 may be, for example, 4 MHz or higher. A bulk piezoelectric element may be used as the piezoelectric element 314 in place of the composite piezoelectric element.

4.4 Operation of Vibrating Piezoelectric Element

In the vibrating unit 310 shown in FIG. 5, the second bolt 306 applies pressure for pressing the projection 302 of the vibration transmitting member 311 against the nozzle holder 127, and pressure for holding the piezoelectric element 314 between the retaining member 315 and the vibration transmitting member 311.

The pressure can be adjusted by adjusting threading torque of each of the first bolts 308 and the second bolt 306. In this case, the threading torque of each of the first bolts 308 and the second bolt 306 may be adjusted such that vibration generated by the piezoelectric element 314 is transmitted through the projection 302 of the vibration transmitting member 311 to the target substance in the tank 120.

The piezoelectric element 314 can generate vibration by expanding and contracting in accordance with a voltage having a predetermined waveform applied from the piezoelectric power source 114. The generated vibration may be transmitted through the projection 302 of the vibration transmitting member 311, the nozzle holder 127, the nozzle 126, the tank 120, and the like to the target substance in a target channel. Thus, the jet of the target substance discharged through the nozzle hole 124 can be changed into droplets of a predetermined size at predetermined intervals.

The vibration transmitting member 311 is cooled by coolant flowing through a coolant pipe 303. This can suppress an increase in temperature of the piezoelectric element 314 to Curie point or higher due to heat from the heater 130 transmitted through the tank 120, the nozzle holder 127, and the like. The Curie point of the piezoelectric element 314 may be in the range of 150° C. to 350° C.

A voltage is applied from the piezoelectric power source 114 to the piezoelectric element 314. As described above, the frequency of the voltage may be lower than the resonance frequency of the piezoelectric element 314, for example, lower than 4 MHz. The frequency of the voltage may be, for example, 3 MHz. The frequency of the voltage being lower than the resonance frequency of the piezoelectric element 314, for example, lower than 4 MHz allows the piezoelectric element 314 to vibrate at a frequency equal to or lower than the resonance frequency. This can suppress generation of vibration noise. A composite piezoelectric element having a resonance frequency of 3 MHz to 6 MHz is relatively easily available. Thus, the frequency of the voltage applied to the piezoelectric element 314 may be set in the range of 2 MHz to 5 MHz.

Generally, when a frequency of vibration matches a natural frequency of components on a vibration transmitting path, the vibration may be amplified by resonance of the components. Thus, to suppress amplification of vibration noise generated by the components on the vibration transmitting path including the vibration transmitting member 311, it is preferable that the frequency of the vibration noise that may be generated does not match the natural frequency of the components. The piezoelectric element 314 shown in FIG. 5 is an example of "piezoelectric element provided in the chamber" in the present disclosure.

Figure 6:
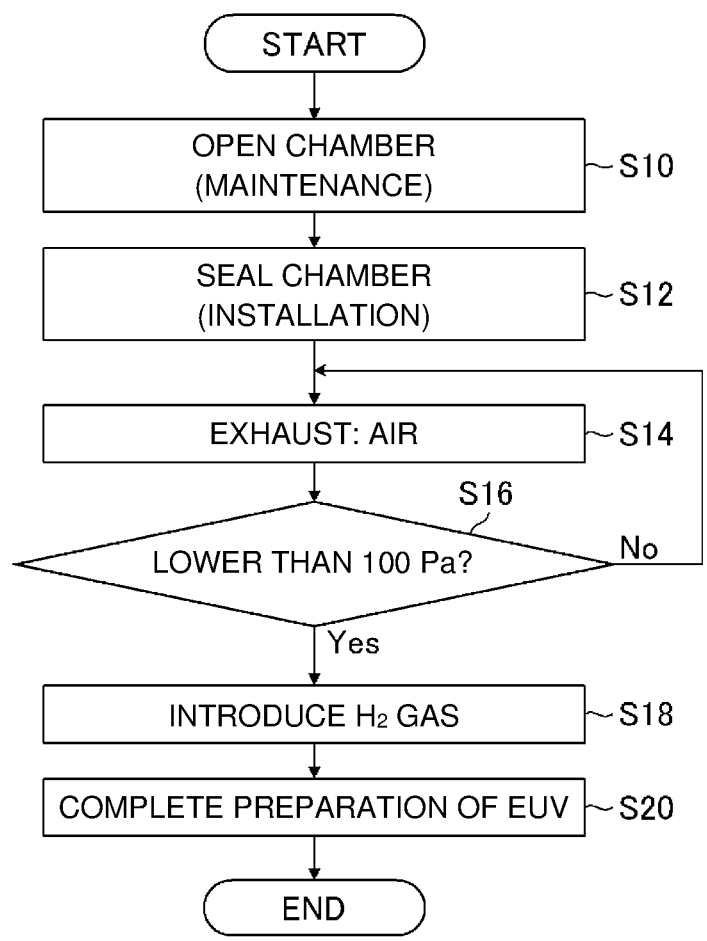
FIG. 6 is a flowchart of exemplary processing of preparation for operation of a chamber.

5. Preparation for Operation and Preparation for Maintenance of Chamber 5.1 Processing of Preparation for Operation of Chamber FIG. 6 is a flowchart of exemplary processing of preparation for operation of the chamber. The flowchart of preparation for operation of the chamber shown in FIG. 6 includes a chamber opening step S10, a chamber sealing step S12, an exhausting step S14, an exhaust pressure determining step S16, a gas introducing step S18, and a preparation for operation completing step S20.

In the chamber opening step S10, for example, the chamber 16 arranged in the EUV light generating apparatus 12 shown in FIG. 2 is opened to atmosphere. In the chamber opening step S10, after the chamber 16 is opened to atmosphere, maintenance and the like of the inside of the chamber 16 can be performed.

In the chamber sealing step S12, for example, the inside of the chamber 16 after the maintenance is sealed. In the chamber sealing step S12, the chamber 16 transported from a place such as a factory, which is different from a place where the EUV light generating apparatus 12 is located, can be arranged in the EUV light generating apparatus 12. The maintenance includes, for example, replacement of an optical member such as the EUV light condensing mirror 24 shown in FIG. 2, replacement of the droplet generator 110, adjustment of an optical axis of the pulse laser beam 23 to be applied to the droplet 122, and the like.

In the exhausting step S14, the EUV light generation control unit 40 shown in FIG. 2 opens the exhaust valve 104, operates the vacuum pump 106, and exhausts gas from the chamber 16. Thus, the gas such as air can be exhausted from the chamber 16.

In the exhaust pressure determining step S16, the EUV light generation control unit 40 determines whether or not the pressure in the chamber 16 is lower than 100 Pa in accordance with a detection value of the pressure sensor 102. When the detection value of the pressure sensor 102 is 100 Pa or higher, the EUV light generation control unit 40 determines No and continues the exhausting step S14.

When the detection value of the pressure sensor 102 is lower than 100 Pa, the EUV light generation control unit 40 determines Yes, closes the exhaust valve 104, stops the operation of the vacuum pump 106, and finishes the exhaust of the gas from the chamber 16. Then, the EUV light generation control unit 40 goes to the gas introducing step S18.

In the gas introducing step S18, the EUV light generation control unit 40 introduces hydrogen gas from a hydrogen gas inlet (not shown) into the chamber 16 through a hydrogen gas ($H_2$ gas) introducing channel (not shown). The hydrogen gas introducing channel may have the same configuration as that of a purge gas introducing channel. In the gas introducing step S18, the pressure in the chamber 16 may be set to lower than 100 Pa. For example, the pressure in the chamber 16 may be 70 Pa. After the pressure in the chamber 16 reaches predetermined pressure in the gas introducing step S18, the EUV light generation control unit 40 goes to the preparation for operation completing step S20.

In the preparation for operation completing step S20, the EUV light generation control unit 40 prepares for operation of the chamber 16 required for emission of EUV light. After the preparation for operation completing step S20, the EUV light generating apparatus 12 can emit EUV light.

5.2 Processing of Preparation for Maintenance of Chamber

Figure 7:
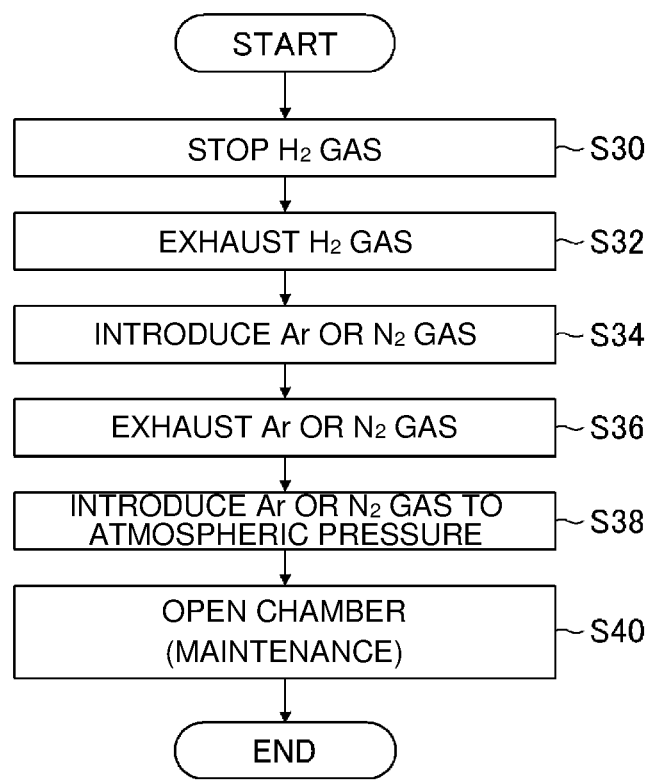
FIG. 7 is a flowchart of exemplary processing of preparation for maintenance of the chamber.

FIG. 7 is a flowchart of exemplary processing of preparation for maintenance of the chamber. The flowchart of the preparation for maintenance of the chamber shown in FIG. 7 includes a gas introduction stopping step S30, a gas exhausting step S32, a purge gas introducing step S34, a purge gas exhausting step S36, a purge gas reintroducing step S38, and a chamber opening step S40.

In the gas introduction stopping step S30, the EUV light generation control unit 40 stops the introduction of the hydrogen gas into the chamber 16. In the gas exhausting step S32, the EUV light generation control unit 40 opens the exhaust valve 104, operates the vacuum pump 106, and exhausts the hydrogen gas from the chamber 16. After the pressure in the chamber 16 reaches the predetermined pressure or lower, the EUV light generation control unit 40 closes the exhaust valve 104, and stops the operation of the vacuum pump 106. Then, the EUV light generation control unit 40 goes to the purge gas introducing step S34.

In the purge gas introducing step S34, the EUV light generation control unit 40 opens the introducing valve 109, operates the mass flow controller 108, and introduces purge gas from a gas introducing source into the chamber 16. The purge gas may be argon gas or nitrogen gas. When the pressure in the chamber 16 reaches the predetermined pressure or higher, the EUV light generation control unit 40 goes to the purge gas exhausting step S36.

In the purge gas exhausting step S36, the EUV light generation control unit 40 exhausts the purge gas from the chamber 16. Specifically, the EUV light generation control unit 40 closes the introducing valve 109, and stops the operation of the mass flow controller 108. Further, the EUV light generation control unit 40 opens the exhaust valve 104, and operates the vacuum pump 106. When the pressure in the chamber 16 reaches the predetermined pressure or lower, the EUV light generation control unit 40 goes to the purge gas reintroducing step S38.

The purge gas introducing step S34 and the purge gas exhausting step S36 constitute a gas replacing step. The EUV light generation control unit 40 may perform the gas replacing step several times and then perform the purge gas reintroducing step S38.

In the purge gas reintroducing step S38, the EUV light generation control unit 40 introduces the purge gas into the chamber 16 until the pressure in the chamber 16 reaches atmospheric pressure. Specifically, the EUV light generation control unit 40 closes the exhaust valve 104, and stops the operation of the vacuum pump 106. Further, the EUV light generation control unit 40 opens the introducing valve 109, and operates the mass flow controller 108. After the purge gas reintroducing step S38, the EUV light generation control unit 40 goes to the chamber opening step S40.

In the chamber opening step S40, the chamber 16 is opened to atmosphere. This allows maintenance of the chamber 16.

6. Problem

In the chamber 16 shown in FIG. 2, the piezoelectric actuator 94A for adjusting the positions of the laser beam condensing mirror 56 and the high reflective plane mirror 93 is provided to adjust the applying position of the pulse laser beam 23 to the droplet 122. Also, the vibrating piezoelectric element 128 for discharging droplets is provided in the chamber 16. The piezoelectric actuator 94A may use the piezoelectric element 202 shown in FIG. 4. The vibrating piezoelectric element 128 may use the piezoelectric element 314 shown in FIG. 5.

For example, if a rotary motor is used to move the stage driven by the piezoelectric actuator 94A, the rotary motor is likely to be affected by the magnetic field 155 shown in FIG. 3. Also, a magnetic field generated by the rotary motor may affect the magnetic field 155 shown in FIG. 3. Thus, the piezoelectric actuator 94A uses a piezoelectric element that is less likely to be affected by the magnetic field 155 and that does not generate a magnetic field affecting the magnetic field 155.

If the piezoelectric actuator 94A is driven when the pressure in the chamber 16 is within a specific range, for example, in vacuum, the piezoelectric element as a drive source of the piezoelectric actuator 94A is damaged by breakdown.

An analysis of a breakdown voltage in vacuum may refer to Paschen's law. According to Paschen's law, spark discharge in vacuum is caused by the fact that electrons accelerated in an electric field collide with gas molecules to ionize gas. Thus, with a smaller amount of gas, collision is less likely to occur, thereby increasing a voltage required for spark discharge. Also with a larger amount of gas, the electrons are less likely to be sufficiently accelerated before collision, thereby increasing a voltage required for spark discharge. The voltage required for spark discharge has a minimum value therebetween.

The Paschen curve, which represents the voltage required for spark discharge relative to a value obtained by multiplying pressure of gas by a distance between electrodes, shows the tendency described above irrespective of the type of gas. On the other hand, the voltage required for spark discharge for each value obtained by multiplying pressure of gas by a distance between electrodes differs depending on the type of gas.

Figure 8:
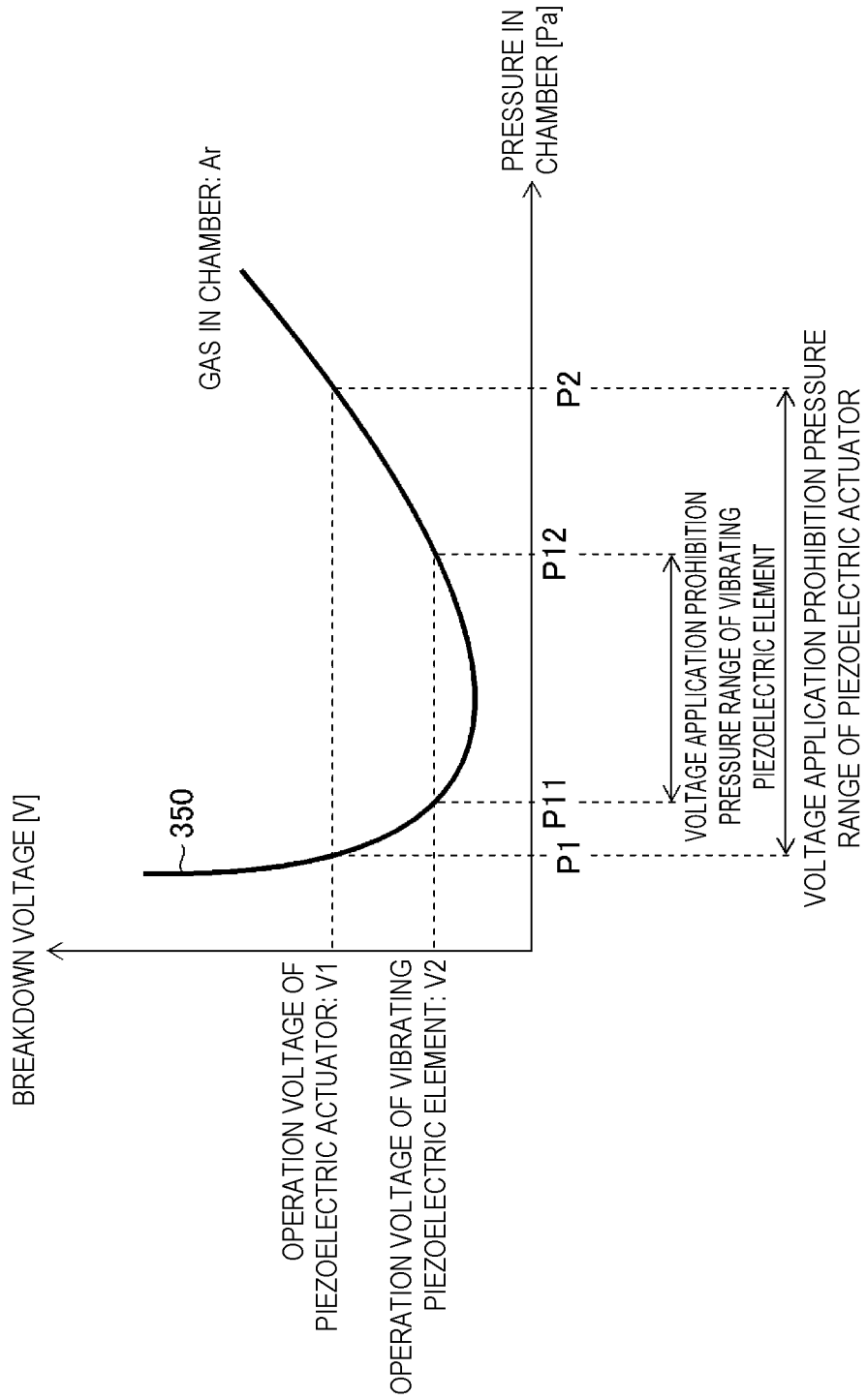
FIG. 8 is a graph showing a relationship between pressure in the chamber and a breakdown voltage of a piezoelectric element.

FIG. 8 is a graph showing a relationship between the pressure in the chamber and the breakdown voltage of the piezoelectric element. The curve 350 shown in FIG. 8 shows an example when argon gas is introduced into the chamber 16. The inventor has derived the relationship between the pressure in the chamber 16 and the breakdown voltage of the piezoelectric element shown in FIG. 8.

In FIG. 8, V1 denotes an operation voltage of the piezoelectric element used in the piezoelectric actuator 94A shown in FIG. 2. V2 denotes an operation voltage of the vibrating piezoelectric element 128. "Operation voltage" is a voltage applied to a piezoelectric element to cause predetermined operation of the piezoelectric element.

P1 denotes a pressure lower limit value of a voltage application prohibition pressure range of the piezoelectric actuator 94A. The voltage application prohibition pressure range is a range of pressure at which application of a voltage causes breakdown. P2 denotes a pressure upper limit value of the voltage application prohibition pressure range of the piezoelectric actuator 94A. P11 denotes a pressure lower limit value of a voltage application prohibition pressure range of the vibrating piezoelectric element 128. P12 denotes a pressure upper limit value of the voltage application prohibition pressure range of the vibrating piezoelectric element 128.

When the breakdown voltage is 250 volts [V], the pressure lower limit value P1 of the voltage application prohibition pressure range in an argon gas atmosphere is 100 Pa, and the pressure upper limit value P2 of the voltage application prohibition pressure range is 400 kilopascals [kPa]. When the breakdown voltage is 150 V, the pressure lower limit value P11 of the voltage application prohibition pressure range in the argon gas atmosphere is 150 Pa, and the pressure upper limit value P12 of the voltage application prohibition pressure range is 300 kPa.

Specifically, when the argon gas is introduced into the chamber 16, and the voltage applied to the piezoelectric element is 250 V, the voltage application prohibition pressure range may be 100 Pa to 400 kPa both inclusive. When the voltage applied to the piezoelectric element is 150 V, the voltage application prohibition pressure range may be 150 Pa to 300 kPa both inclusive.

Table 1 shows a relationship between the type of gas introduced into the chamber 16 and the voltage application prohibition pressure range. Table 1 shows the pressure lower limit value P1 and the pressure upper limit value P2 of the voltage application prohibition pressure range when the voltage applied to the piezoelectric element is 250 V.

TABLE 1

| TYPE OF GAS | PRESSURE LOWER LIMIT VALUE P1 | PRESSURE UPPER LIMIT VALUE P2 |
|---|---|---|
| AIR | 100 Pa | 50 kPa |
| ARGON | 100 Pa | 400 kPa |
| NITROGEN | 100 Pa | 10 kPa |

When the gas introduced into the chamber 16 is air, argon gas, or nitrogen gas, the pressure lower limit value P1 of the voltage application prohibition pressure range is 100 Pa. When the gas introduced into the chamber 16 is air, the pressure upper limit value P2 of the voltage application prohibition pressure range is 50 kPa. When the gas introduced into the chamber 16 is nitrogen gas, the pressure upper limit value P2 of the voltage application prohibition pressure range is 10 kPa.

The voltage application prohibition pressure range of the piezoelectric actuator shown in FIG. 8 is an example of "first range" in the present disclosure. The voltage application prohibition pressure range of the vibrating piezoelectric element is an example of "first range" in the present disclosure. Further, the voltage application prohibition pressure range from the pressure lower limit value to the pressure upper limit value for each type of gas shown in Table 1 is an example of "first range" in the present disclosure.

For example, when air is exhausted from the chamber 16 as in the exhausting step S14 shown in FIG. 6, the pressure in the chamber 16 changes from atmospheric pressure to vacuum. In that process, the pressure in the chamber 16 passes the voltage application prohibition pressure range of the piezoelectric actuator and the voltage application prohibition pressure range of the vibrating piezoelectric element shown in FIG. 8.

Also, after hydrogen gas is exhausted from the chamber 16 in the gas exhausting step S32 shown in FIG. 7, inert gas such as argon gas or nitrogen gas is introduced into the chamber 16 in the purge gas introducing step S34 to remove impurities in the chamber 16. Further, in the purge gas exhausting step S36, argon gas or nitrogen gas is exhausted from the chamber 16.

Then, in the purge gas reintroducing step S38, argon gas or nitrogen gas is introduced into the chamber 16 until the pressure in the chamber 16 reaches atmospheric pressure, and in the chamber opening step S40, air flows into the chamber 16 when the chamber 16 is opened.

In this case, the pressure in the chamber 16 changes from vacuum to atmospheric pressure. In that process, the pressure in the chamber 16 passes the voltage application prohibition pressure range of the piezoelectric actuator and the voltage application prohibition pressure range of the vibrating piezoelectric element shown in FIG. 8.

Also in the steps other than those described above, when an unexpected pressure change occurs in the chamber 16, the pressure in the chamber 16 is likely to fall within the voltage application prohibition pressure range of the piezoelectric actuator and the voltage application prohibition pressure range of the vibrating piezoelectric element shown in FIG. 8.

Specifically, in the process of the pressure in the chamber 16 changing from atmospheric pressure to vacuum, the pressure in the chamber 16 passes the voltage application prohibition pressure range of the piezoelectric actuator and the voltage application prohibition pressure range of the vibrating piezoelectric element. Thus, an interlock is required for prohibiting application of a voltage to the piezoelectric element. The same applies to the process of the pressure in the chamber 16 changing from vacuum to atmospheric pressure.

Further, if an unexpected pressure change occurs in the chamber 16, the pressure in the chamber 16 is likely to fall within the voltage application prohibition pressure range of the piezoelectric actuator and the voltage application prohibition pressure range of the vibrating piezoelectric element. Thus, the interlock is required as appropriate.

7. Embodiment 1

7.1 Configuration

First, an interlock during normal operation of an EUV light generating apparatus 12 will be described. "During normal operation" refers to a period during which normal operation is performed. "During normal operation" includes a period of emission of EUV light. "During normal operation" may include, for example, a period of preparation for operation of a chamber shown in FIG. 6 before the emission of EUV light.

The exhausting step S14 in the processing of preparation for operation of the chamber shown in FIG. 6 particularly requires an interlock.

Figure 9:
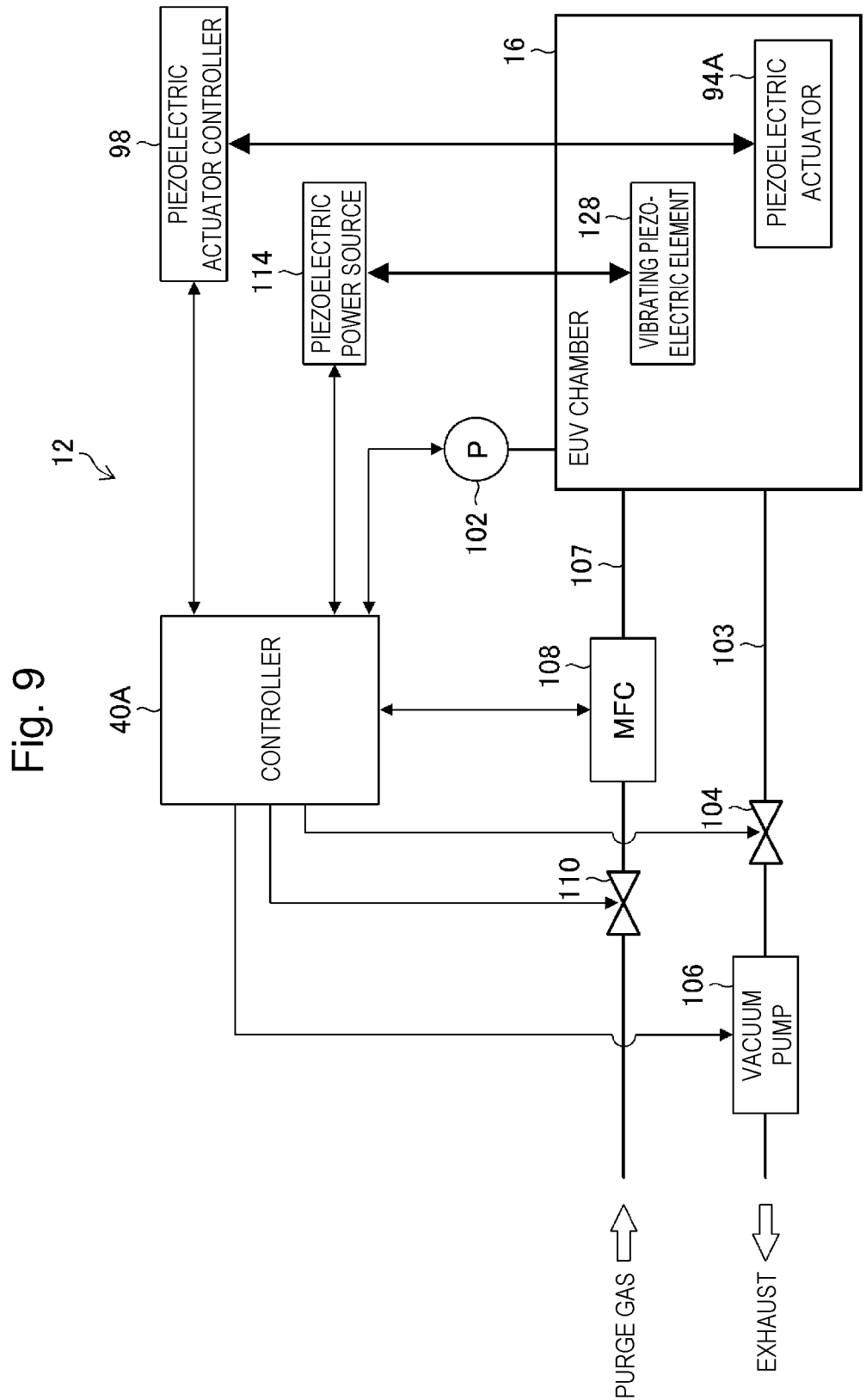
FIG. 9 schematically shows a configuration relating to an interlock in an EUV light generating apparatus according to Embodiment 1.

FIG. 9 schematically shows a configuration relating to an interlock in an EUV light generating apparatus according to Embodiment 1. FIG. 9 shows some components extracted from the EUV light generating apparatus 12 shown in FIG. 2.

A controller 40A controls a piezoelectric actuator 94A through a piezoelectric actuator controller 98 in accordance with a detection value of a pressure sensor 102. The controller 40A also controls a vibrating piezoelectric element 128 through a piezoelectric power source 114 in accordance with a detection value of the pressure sensor 102.

The EUV light generating apparatus 12 includes a memory unit (not shown). The memory unit (not shown) stores a relationship between a voltage applied to a piezoelectric element and a voltage application prohibition pressure range for each gas introduced into a chamber 16. The controller 40A can refer to a type of gas introduced into the chamber 16 and a voltage applied to the piezoelectric element, and read information on a voltage application prohibition pressure range from the memory unit (not shown).

7.2 Operation

The EUV light generating apparatus 12 according to Embodiment 1 has a limit such that the piezoelectric element provided in the chamber 16 is not operated within the voltage application prohibition pressure range set for each gas introduced into the chamber 16. The EUV light generating apparatus 12 also controls the piezoelectric actuator 94A and the like such that a voltage is not applied to the piezoelectric element. Specifically, when pressure in the chamber 16 falls within the voltage application prohibition pressure range of the piezoelectric element, the piezoelectric element is interlocked. The interlock allows switching between permission and prohibition of servo-on. Permission of servo-on is synonymous with enabling of servo-on.

An EUV light generating system 10 according to Embodiment 1 enables servo-on when the pressure in the chamber 16 is lower than 100 Pa. The EUV light generating system 10 sets servo-off when the pressure in the chamber 16 is 100 Pa or higher. Further, in the EUV light generating system 10, the pressure in the chamber 16 is likely to increase and fall within the voltage application prohibition pressure range during the servo-on when the pressure in the chamber 16 is lower than 100 Pa. In this case, chamber purging operation of introducing purge gas into the chamber 16 is prohibited. Specifically, during the servo-on when the pressure in the chamber 16 is lower than 100 Pa, control to open an introducing valve 109 shown in FIG. 2 is prohibited. "During the servo-on" refers to a period of the servo-on. "During the servo-on" is an example of "while a voltage is being applied" in the present disclosure.

During evacuation performed by opening an exhaust valve 104 and operating a vacuum pump 106, the pressure in the chamber 16 is likely to fall within the voltage application prohibition pressure range due to a change in pressure in the chamber 16. In this case, the servo-on is prohibited. "During evacuation" refers to a period of evacuation of the chamber 16. "During evacuation" is an example of "while the exhaust unit is exhausting the gas from the chamber" in the present disclosure.

During chamber purging performed by opening the introducing valve and operating a mass flow controller 108, the pressure in the chamber 16 is likely to fall within the voltage application prohibition pressure range. In this case, the servo-on is prohibited. During the servo-on, introduction of the purge gas into the chamber 16 is prohibited. "Chamber purging" refers to purging of the chamber 16. "During chamber purging" refers to a period of purging of the chamber 16. "During chamber purging" is an example of "while the gas introducing unit is introducing the gas into the chamber" in the present disclosure.

A servo-on instruction is a signal output from an EUV light generation control unit 40 shown in FIG. 2. The servo-on instruction includes, for example, a signal transmitted from the EUV light generation control unit 40 to a piezoelectric actuator controller 98 when a focusing position of a pulse laser beam 23 is adjusted.

Gas introduced into the chamber 16 during the normal operation of the EUV light generating apparatus 12 is hydrogen gas. On the other hand, gas introduced into the chamber 16 during maintenance of the chamber 16 is argon gas or nitrogen gas. A voltage application prohibition pressure range when the hydrogen gas is introduced into the chamber 16 is included in a voltage application prohibition pressure range when the argon gas is introduced into the chamber 16.

When the argon gas is introduced into the chamber 16, the voltage application prohibition pressure range is wider than when the hydrogen gas is introduced into the chamber 16. Thus, the voltage application prohibition pressure range when the argon gas is introduced into the chamber 16 can be set for the case where the hydrogen gas is introduced into the chamber 16.

Figure 10:
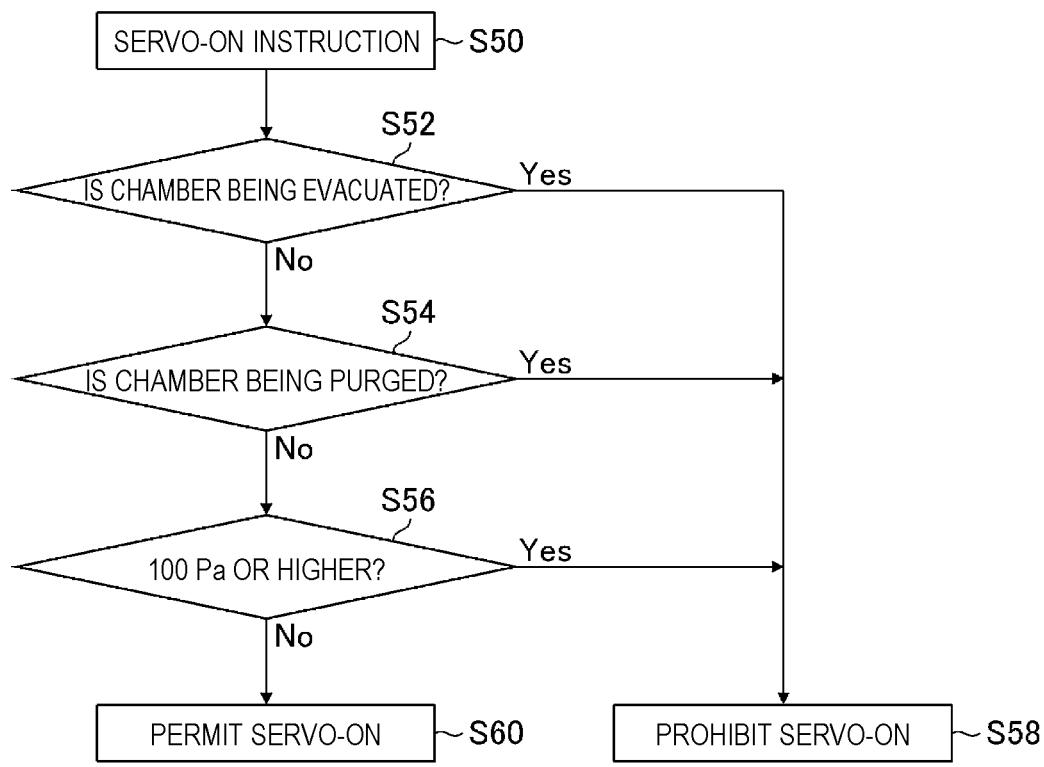
FIG. 10 is a flowchart of exemplary processing when a voltage is not applied to a piezoelectric actuator in the interlock according to Embodiment 1.

FIG. 10 is a flowchart of exemplary processing when a voltage is not applied to the piezoelectric actuator in the interlock according to Embodiment 1. FIG. 10 shows a control flow during the normal operation of the EUV light generating apparatus 12. The interlock during the normal operation of the EUV light generating apparatus 12 shown in FIG. 10 includes a servo-on instruction obtaining step S50, a first chamber state determining step S52, a second chamber state determining step S54, and a first pressure determining step S56. The interlock during the normal operation of the EUV light generating apparatus 12 also includes a servo-on prohibition setting step S58*a* and a servo-on permission setting step S60.

In the servo-on instruction obtaining step S50, the controller 40A shown in FIG. 9 obtains a servo-on instruction during the servo-off. The servo-on instruction may be, for example, input by operating an input device. The servo-on instruction may be, for example, generated by the EUV light generation control unit 40 itself to change an applying position of the pulse laser beam 23. "During the servo-off" refers to a period of the servo-off.

In the first chamber state determining step S52, the EUV light generation control unit 40 determines whether or not the chamber 16 is being evacuated. Specifically, in the first chamber state determining step S52, the controller 40A determines whether or not the exhaust valve 104 is opened and the vacuum pump 106 is being operated. Alternatively, in the first chamber state determining step S52, the controller 40A may determine whether or not the exhaust valve 104 is opened or whether or not the vacuum pump 106 is being operated.

In the first chamber state determining step S52, when the chamber is being evacuated, the controller 40A determines Yes and goes to the servo-on prohibition setting step S58. When the evacuation is not being performed, the controller 40A determines No and goes to the second chamber state determining step S54.

In the second chamber state determining step S54, the controller 40A determines whether or not the chamber is being purged. Specifically, in the second chamber state determining step S54, the controller 40A determines whether or not the introducing valve 109 is opened and the mass flow controller 108 is being operated. Alternatively, in the second chamber state determining step S54, the controller 40A may determine whether or not the introducing valve 109 is opened or whether or not the mass flow controller 108 is being operated.

In the second chamber state determining step S54, when the chamber is being purged, the controller 40A determines Yes and goes to the servo-on prohibition setting step S58. When the chamber is not being purged, the controller 40A determines No and goes to the first pressure determining step S56.

In the first pressure determining step S56, the controller 40A determines whether or not the pressure in the chamber 16 is 100 Pa or higher in accordance with the detection value of the pressure sensor 102. In the first pressure determining step S56, when the pressure in the chamber 16 is 100 Pa or higher, the controller 40A determines Yes and goes to the servo-on prohibition setting step S58.

In the servo-on prohibition setting step S58, the controller 40A prohibits the servo-on. The servo-on prohibition includes, for example, transmitting, to the piezoelectric actuator controller 98, an instruction to prohibit application of a voltage to the piezoelectric actuator 94A.

In the first pressure determining step S56, when the pressure in the chamber 16 is lower than 100 Pa, the controller 40A determines No and goes to the servo-on permission setting step S60. In the servo-on permission setting step S60, the controller 40A transmits, to the piezoelectric actuator controller 98, an instruction to apply a voltage to the piezoelectric actuator 94A. Specifically, after the servo-on permission setting step S60, the piezoelectric actuator 94A can be operated. The first pressure determining step S56 is an example of a step including "pressure obtaining step of obtaining information on pressure in the chamber" in the present disclosure. The servo-on prohibition setting step S58 and the servo-on permission setting step S60 are examples of "controlling step of switching between application and non-application of a voltage to a piezoelectric element" in the present disclosure.

The interlock of the piezoelectric actuator 94A shown in FIG. 10 can be applied to the vibrating piezoelectric element 128 shown in FIG. 9. Specifically, at least any of during the evacuation of the chamber 16, during the chamber purging, and when the pressure in the chamber 16 is 100 Pa or higher, the controller 40A can prohibit application of a voltage from the piezoelectric power source 114 to the vibrating piezoelectric element 128. The interlock of the piezoelectric actuator 94A shown in FIGS. 11, 13, and 14 can be also applied to the vibrating piezoelectric element 128.

The determination in each of the first chamber state determining step S52, the second chamber state determining step S54, and the first pressure determining step S56 shown in FIG. 10 is an example of "determining whether or not to apply a voltage to the piezoelectric element" in the present disclosure.

Figure 11:
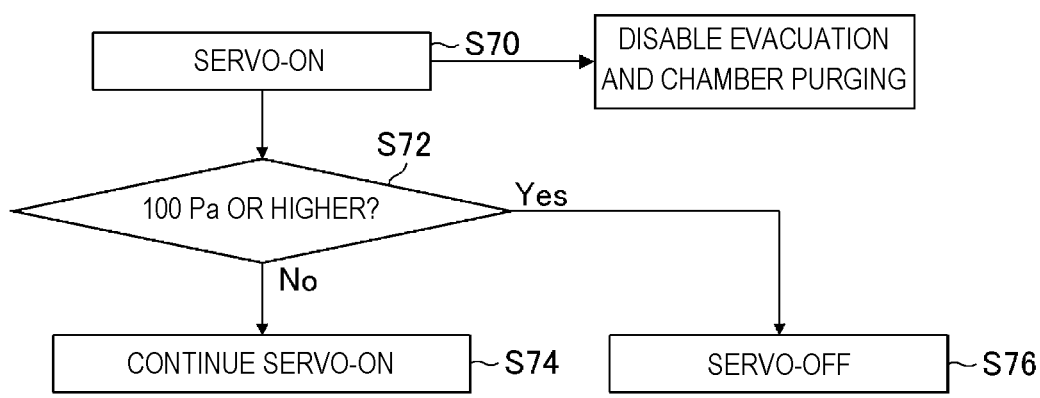
FIG. 11 is a flowchart of exemplary processing when a voltage is applied to the piezoelectric actuator in the interlock according to Embodiment 1.

FIG. 11 is a flowchart of exemplary processing when a voltage is applied to the piezoelectric actuator in the interlock according to Embodiment 1.

The interlock during the normal operation of the EUV light generating apparatus 12 shown in FIG. 11 includes a servo-on permission setting step S70, a second pressure determining step S72, a servo-on continuation permitting step S74, and a servo-off processing step S76.

In the servo-on permission setting step S70, the controller 40A shown in FIG. 9 transmits, to the piezoelectric actuator controller 98, an instruction to apply a voltage to the piezoelectric actuator 94A. The servo-on permission setting step S70 shown in FIG. 11 can be performed when the servo-on is permitted in the servo-on permission setting step S60 shown in FIG. 10.

During the servo-on, the evacuation and the chamber purging are prohibited. For performing the evacuation and the chamber purging, the servo-off is performed. Further, during the servo-on, the pressure in the chamber 16 is monitored in the second pressure determining step S72.

In the second pressure determining step S72, the controller 40A determines whether or not the pressure in the chamber 16 is 100 Pa or higher. In the second pressure determining step S72, when the pressure in the chamber 16 is lower than 100 Pa, the controller 40A determines No and goes to the servo-on continuation permitting step S74. In the servo-on continuation permitting step S74, the controller 40A continues the servo-on. In the servo-on continuation permitting step S74, the controller 40A may transmit, to the piezoelectric actuator controller 98, an instruction to continue the application of a voltage to the piezoelectric actuator 94A.

In the second pressure determining step S72, when the pressure in the chamber 16 is 100 Pa or higher, the controller 40A determines Yes and goes to the servo-off processing step S76. In the servo-off processing step S76, the controller 40A performs servo-off processing. In the servo-off processing step S76, the controller 40A transmits, to the piezoelectric actuator controller 98, an instruction not to apply a voltage to the piezoelectric actuator 94A. During the servo-off, when the controller 40A receives a servo-on instruction, the interlock shown in FIG. 10 is performed. The second pressure determining step S72 is an example of a step including "pressure obtaining step of obtaining information on pressure in the chamber" in the present disclosure. The servo-on continuation permitting step S74 and the servo-off processing step S76 are examples of "controlling step of switching between application and non-application of a voltage to a piezoelectric element" in the present disclosure.

7.3 Effect

With the EUV light generating apparatus 12 according to Embodiment 1, when the pressure in the chamber 16 falls within the voltage application prohibition pressure range, the interlock is set to prohibit the application of a voltage to the piezoelectric actuator 94A. Specifically, whether or not to apply a voltage to the piezoelectric actuator 94A is determined. Thus, during the normal operation of the EUV light generating apparatus 12, damage to the piezoelectric actuator 94A can be prevented, which is caused by driving the piezoelectric actuator 94A when the pressure in the chamber 16 is within the voltage application prohibition pressure range.

When the servo-on instruction is obtained during the servo-off, the servo-on is prohibited during the evacuation of the chamber 16 and the chamber purging. Thus, damage to the piezoelectric actuator 94A can be prevented, which is caused by driving the piezoelectric actuator 94A during the evacuation of the chamber 16 or during the chamber purging.

During the servo-on, the evacuation of the chamber 16 and the chamber purging are prohibited. Thus, during the evacuation of the chamber 16 or during the chamber purging, the pressure in the chamber 16 falls within the voltage application prohibition pressure range, and damage to the piezoelectric actuator 94A caused by driving the piezoelectric actuator 94A can be prevented.

During the servo-on, the servo-off is performed when the pressure in the chamber 16 is 100 Pa or higher. Thus, damage to the piezoelectric actuator 94A can be prevented, which is caused by driving the piezoelectric actuator 94A when the pressure in the chamber 16 is within the voltage application prohibition pressure range.

8. Embodiment 2

8.1 Configuration

Figure 12:
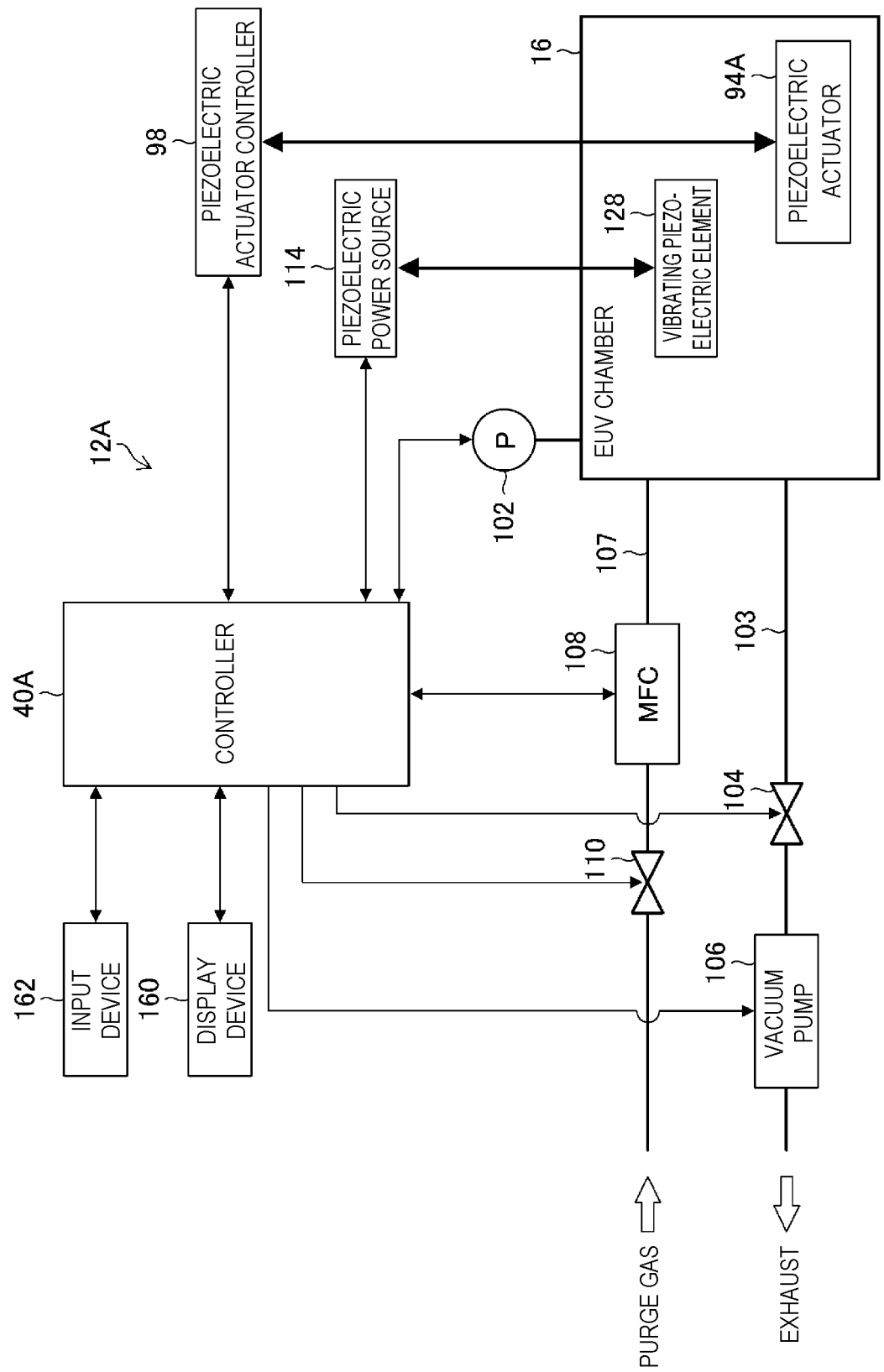
FIG. 12 schematically shows a configuration relating to an interlock in an EUV light generating apparatus according to Embodiment 2.

Next, an interlock during maintenance of the chamber 16 will be described. The purge gas introducing step S34, the purge gas exhausting step S36, and the purge gas reintroducing step S38 in the processing of preparation for maintenance of the chamber shown in FIG. 7 particularly require an interlock. FIG. 12 schematically shows a configuration relating to an interlock in an EUV light generating apparatus according to Embodiment 2.

An EUV light generating apparatus 12A shown in FIG. 12 corresponds to the EUV light generating apparatus 12 shown in FIG. 9 added with a display device 160 and an input device 162. The display device 160 and the input device 162 are connected to the controller 40A. The controller 40A can function as a display driver for controlling the display device 160. The controller 40A also functions as a driver for the input device 162.

The display device 160 can receive an instruction transmitted from the controller 40A, and display information on an interlock in the EUV light generating apparatus 12A. The input device 162 may be an operation member such as a keyboard.

A touch panel monitor device may function as both the display device 160 and the input device 162. The display device 160 is an example of "display unit" in the present disclosure.

8.2 Operation

In the EUV light generating apparatus 12A according to Embodiment 2, during the maintenance of the chamber 16, it is likely that the pressure in the chamber 16 exceeds 50 kPa and servo-on is set in that case. Thus, during the maintenance of the chamber 16, the controller 40A obtains a servo-on instruction, and causes the display device 160 to display the type of gas in the chamber 16 when the pressure in the chamber 16 is higher than 50 kPa.

Further, the controller 40A waits for input of information indicating that the type of gas in the chamber 16 has been confirmed, and determines whether or not to set servo-on in accordance with the type of gas introduced into the chamber 16. For example, when receiving information indicating that the gas in the chamber 16 being air has been confirmed, the controller 40A can permit the servo-on. Specifically, in the EUV light generating apparatus 12A according to Embodiment 2, the voltage application prohibition pressure range can be changed in accordance with the type of gas introduced into the chamber 16.

Figure 13:
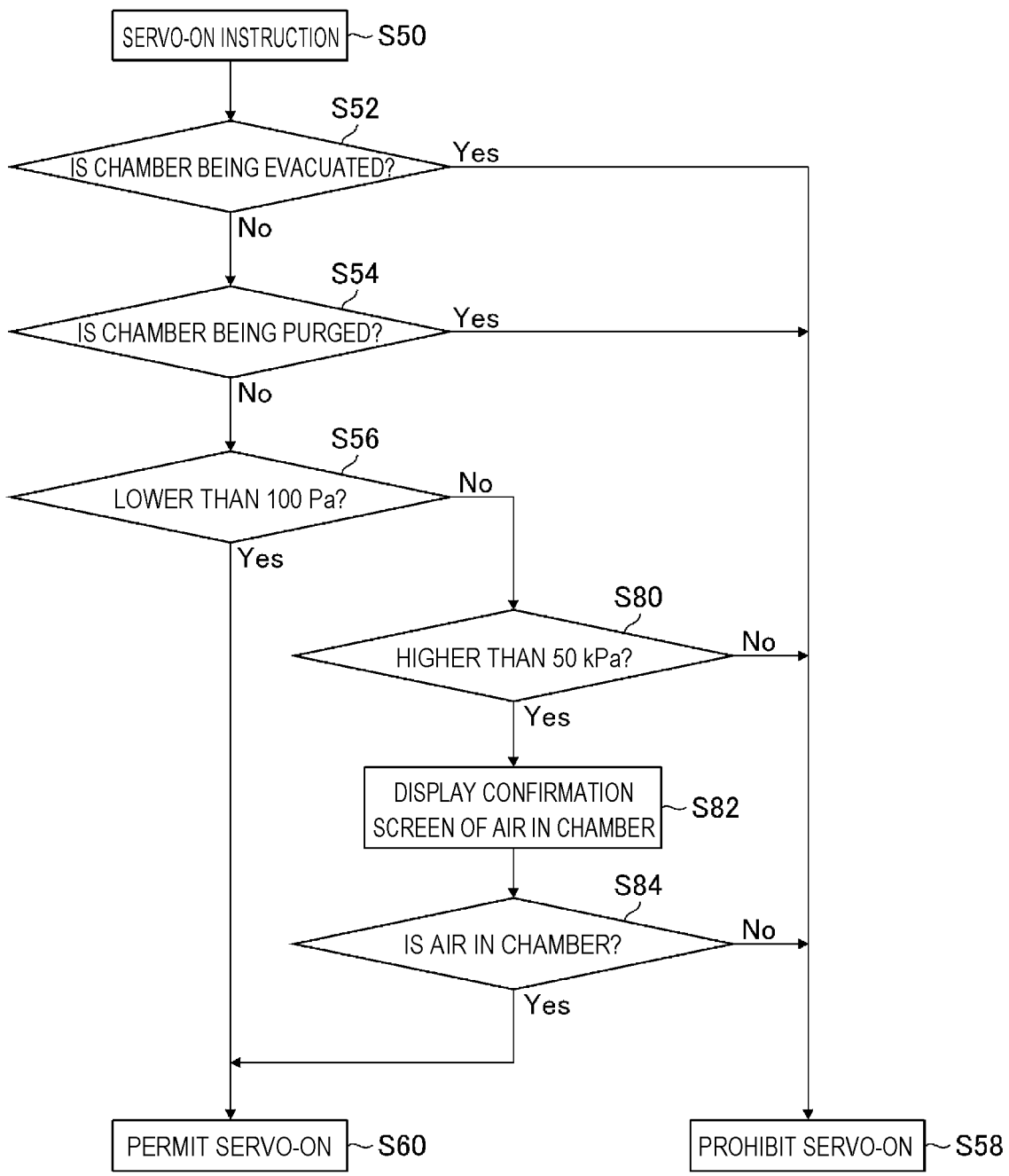
FIG. 13 is a flowchart of exemplary processing when a voltage is not applied to a piezoelectric actuator in the interlock according to Embodiment 2.

FIG. 13 is a flowchart of exemplary processing when a voltage is not applied to the piezoelectric actuator in the interlock according to Embodiment 2. The interlock shown in FIG. 13 corresponds to the interlock shown in FIG. 10 added with a third pressure determining step S80, a displaying step S82, and a gas determining step S84.

In the servo-on instruction obtaining step S50, the controller 40A obtains the servo-on instruction input by operating the input device 162. Then, the controller 40A performs the first chamber state determining step S52, the second chamber state determining step S54, and the first pressure determining step S56. When determining No in the first pressure determining step S56, the controller 40A goes to the third pressure determining step S80.

In the third pressure determining step S80, the controller 40A determines whether or not the pressure in the chamber 16 is higher than 50 kPa in accordance with a detection value of the pressure sensor 102. In the third pressure determining step S80, when the pressure in the chamber 16 is 50 kPa or lower, the controller 40A determines No and goes to the servo-on prohibition setting step S58.

Specifically, when being 100 Pa or higher and 50 kPa or lower, the pressure in the chamber 16 is within the voltage application prohibition pressure range at a voltage of 250 V applied to the piezoelectric element even if either argon gas or air is introduced into the chamber 16, and the servo-on is prohibited.

In the third pressure determining step S80, when the pressure in the chamber 16 is higher than 50 kPa, the controller 40A determines Yes and goes to the displaying step S82. In the displaying step S82, the controller 40A displays, on the display device 160, the type of gas introduced into the chamber 16. Thus, an operator can grasp the type of gas introduced into the chamber 16. The third pressure determining step S80 is an example of a step including "pressure obtaining step of obtaining information on pressure in the chamber" in the present disclosure.

In the displaying step S82, the controller 40A waits for input of information from the input device 162, obtains, from the input device 162, information indicating that the type of gas introduced into the chamber 16 has been confirmed, and then goes to the gas determining step S84.

In the gas determining step S84, the controller 40A determines whether or not the gas introduced into the chamber 16 is air. In the gas determining step S84, when determining that the gas introduced into the chamber 16 is not air, the controller 40A determines No and goes to the servo-on prohibition setting step S58. Specifically, when the gas in the chamber 16 is argon gas, the servo-on is prohibited.

In the gas determining step S84, when determining that the gas introduced into the chamber 16 is air, the controller 40A determines Yes and goes to the servo-on permission setting step S60. Specifically, when the gas in the chamber 16 is air, the servo-on can be permitted.

Figure 14:
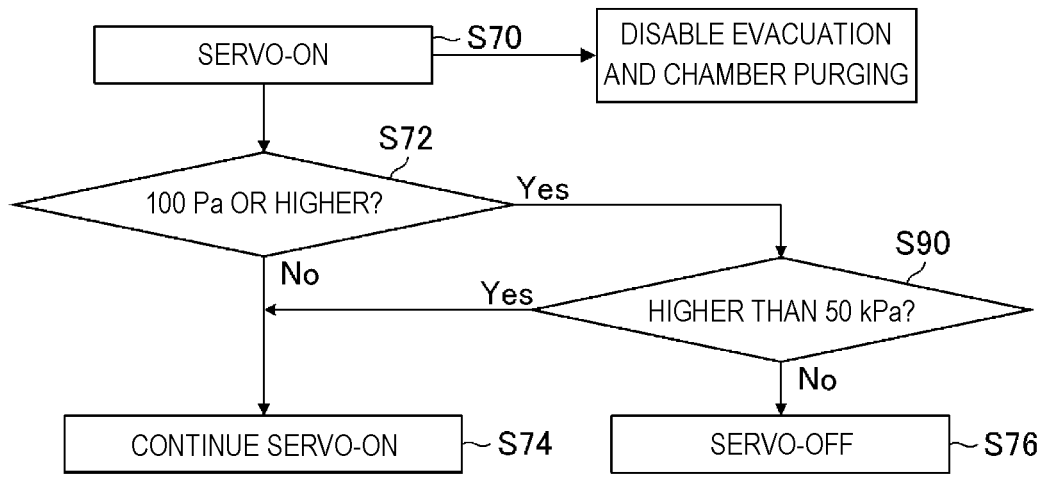
FIG. 14 is a flowchart of exemplary processing when a voltage is applied to the piezoelectric actuator in the interlock according to Embodiment 2.

FIG. 14 is a flowchart of exemplary processing when a voltage is applied to the piezoelectric actuator in the interlock according to Embodiment 2. The interlock shown in FIG. 14 corresponds to the interlock shown in FIG. 11 added with a fourth pressure determining step S90.

In the second pressure determining step S72, when determining Yes, the controller 40A goes to the fourth pressure determining step S90. In the fourth pressure determining step S90, the controller 40A determines whether or not the pressure in the chamber 16 is higher than 50 kPa in accordance with a detection value of the pressure sensor 102.

In the fourth pressure determining step S90, when the pressure in the chamber 16 is 50 kPa or lower, the controller 40A determines No and goes to the servo-off processing step S76. In the fourth pressure determining step S90, when the pressure in the chamber 16 is higher than 50 kPa, the controller 40A determines Yes and goes to the servo-on continuation permitting step S74.

Specifically, when the pressure in the chamber 16 is lower than 100 Pa or higher than 50 kPa, the servo-on is continued. When the pressure in the chamber 16 is 100 Pa or higher and 50 kPa or lower, servo-off is performed. The fourth pressure determining step S90 is an example of "pressure obtaining step of obtaining information on pressure in the chamber" in the present disclosure.

8.3 Effect

With the EUV light generating apparatus 12A according to Embodiment 2, when the pressure in the chamber 16 is higher than 50 kPa during the maintenance of the chamber 16, the servo-on is permitted if the gas introduced into the chamber 16 is air. Thus, during the maintenance of the chamber 16, damage to the piezoelectric actuator 94A can be prevented, which is caused by driving the piezoelectric actuator 94A when the pressure in the chamber 16 is within the voltage application prohibition pressure range.

The display device 160 displays the type of gas introduced into the chamber 16. The controller 40A can permit the servo-on when receiving information indicating that the gas introduced into the chamber 16 being air has been confirmed.

When the pressure in the chamber 16 is 100 Pa or higher and 50 kPa or lower during the servo-on, the servo-off is performed even if the gas introduced into the chamber 16 is air. Thus, damage to the piezoelectric actuator 94A can be prevented, which is caused by driving the piezoelectric actuator 94A when the pressure in the chamber 16 is within the voltage application prohibition pressure range.

9. Combination of Embodiments

Embodiment 1 and Embodiment 2 described above may be combined as appropriate. For example, whether the EUV light generating apparatus 12 is during the normal operation or during the maintenance may be determined, and Embodiment 1 and Embodiment 2 may be switchable in accordance with a determination result.

Figure 15:
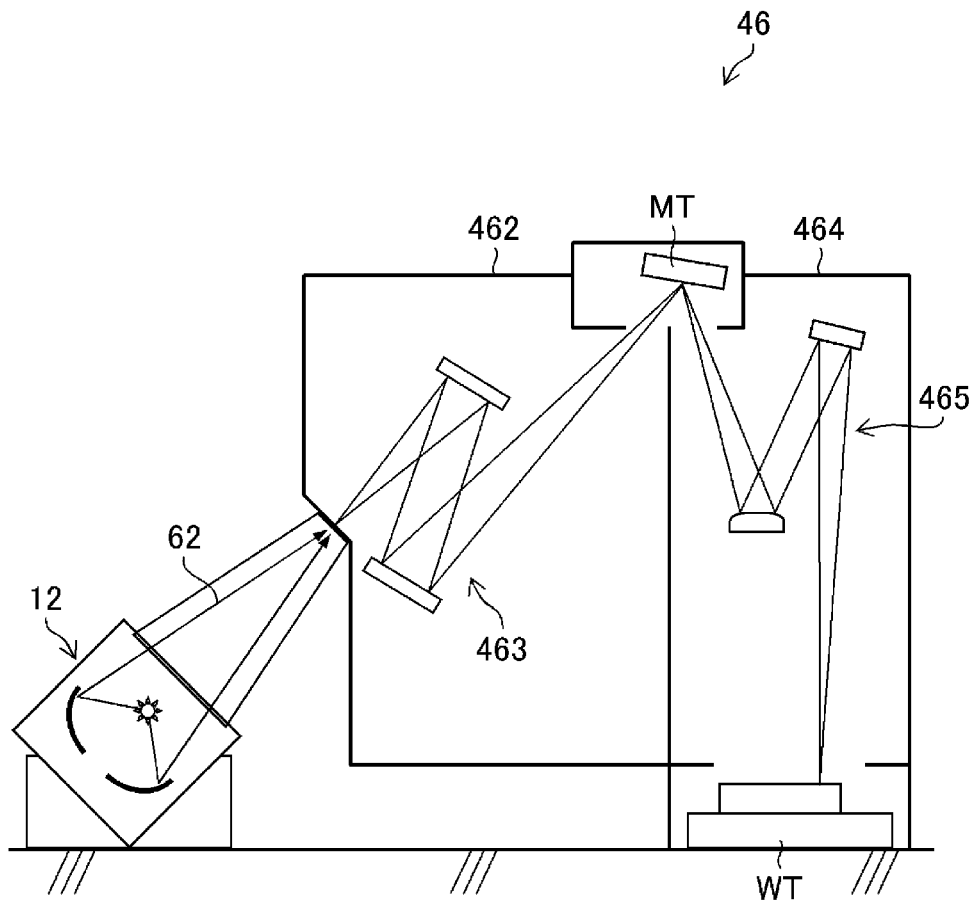
FIG. 15 schematically shows a configuration of an exposure apparatus connected to an EUV light generating apparatus.

10. Exemplary Electronic Device Manufacturing Method Using EUV Light Generating Apparatus FIG. 15 schematically shows a configuration of an exposure apparatus connected to an EUV light generating apparatus. In FIG. 15, the exposure apparatus 46 includes a mask irradiating unit 462 and a workpiece irradiating unit 464. The mask irradiating unit 462 illuminates, with EUV light 62 incident from the EUV light generating apparatus 12, a mask pattern on a mask table MT through a reflective optical system 463. The EUV light generating apparatus 12 includes at least one of the configurations described in Embodiments 1 and 2.

The workpiece irradiating unit 464 forms an image of the EUV light 62 reflected by the mask table MT on a workpiece (not shown) arranged on a workpiece table WT through a reflective optical system 465.

The workpiece is a photosensitive substrate such as a semiconductor wafer coated with photoresist. The exposure apparatus 46 synchronously translates the mask table MT and the workpiece table WT to expose the EUV light reflecting the mask pattern onto the workpiece.

Through an exposure process as described above, a device pattern can be transferred onto the semiconductor wafer, thereby manufacturing a semiconductor device. "Onto the workpiece" is an example of "onto a photosensitive substrate" in the present disclosure. The semiconductor device is an example of "electronic device" in the present disclosure.

The description above is intended to be illustrative and the present disclosure is not limited thereto. Therefore, it would be obvious to those skilled in the art that various modifications to the embodiments of the present disclosure would be possible without departing from the spirit and the scope of the appended claims. Further, it would be also obvious for those skilled in the art that embodiments of the present disclosure would be appropriately combined.

The terms used throughout the present specification and the appended claims should be interpreted as non-limiting terms. For example, terms such as "comprise", "include", "have", and "contain" should not be interpreted to be exclusive of other structural elements. Further, indefinite articles "a/an" described in the present specification and the appended claims should be interpreted to mean "at least one" or "one or more." Further, "at least one of A, B, and C" should be interpreted to mean any of A, B, C, A+B, A+C, B+C, and A+B+C as well as to include combinations of the any thereof and any other than A, B, and C.

What is claimed is:

1. An extreme ultraviolet light generating apparatus for generating extreme ultraviolet light in a chamber, the extreme ultraviolet light generating apparatus comprising:
    a piezoelectric element provided in the chamber;
    a pressure sensor configured to detect pressure in the chamber;
    a gas introducing unit configured to introduce gas into the chamber;
    an exhaust unit configured to exhaust the gas from the chamber; and
    a control unit configured to control application of a voltage to the piezoelectric element,
    the control unit being configured to determine whether or not to apply a voltage to the piezoelectric element based on information on the pressure in the chamber obtained by the pressure sensor.

2. The extreme ultraviolet light generating apparatus according to claim 1, wherein when the pressure in the chamber is within a first range, the control unit determines not to apply a voltage to the piezoelectric element.

3. The extreme ultraviolet light generating apparatus according to claim 2, wherein the first range is 100 Pa or higher.

4. The extreme ultraviolet light generating apparatus according to claim 2, wherein when the gas in the chamber is air, the first range is 100 Pa or higher and 50 kPa or lower.

5. The extreme ultraviolet light generating apparatus according to claim 1, wherein while the exhaust unit is exhausting the gas from the chamber, the control unit determines not to apply a voltage to the piezoelectric element.

6. The extreme ultraviolet light generating apparatus according to claim 1, wherein the gas introducing unit introduces argon into the chamber.

7. The extreme ultraviolet light generating apparatus according to claim 1, wherein while the gas introducing unit is introducing the gas into the chamber, the control unit determines not to apply a voltage to the piezoelectric element.

8. The extreme ultraviolet light generating apparatus according to claim 1, wherein while a voltage is being applied to the piezoelectric element, the exhaust unit is prohibited from exhausting the gas from the chamber.

9. The extreme ultraviolet light generating apparatus according to claim 1, wherein while a voltage is being applied to the piezoelectric element, the gas introducing unit is prohibited from introducing the gas into the chamber.

10. The extreme ultraviolet light generating apparatus according to claim 2, wherein the control unit changes the first range in accordance with a type of gas introduced into the chamber by the gas introducing unit.

11. The extreme ultraviolet light generating apparatus according to claim 1, further comprising a display unit configured to display the type of gas introduced into the chamber by the gas introducing unit.

12. The extreme ultraviolet light generating apparatus according to claim 1, further comprising
    a laser beam condensing optical unit configured to adjust an applying position of a laser beam introduced into the chamber,
    wherein the laser beam condensing optical unit includes
    a laser beam condensing mirror, and
    a piezoelectric actuator configured to move a position of the laser beam condensing mirror, and
    the piezoelectric element is used in the piezoelectric actuator.

13. The extreme ultraviolet light generating apparatus according to claim 1, further comprising
    a target supply unit configured to supply a target substance into the chamber,
    wherein the target supply unit includes
    a nozzle configured to output the target substance in a liquid form, and
    a vibrating unit configured to vibrate the target substance supplied to the nozzle, and
    the piezoelectric element is used in the vibrating unit.

14. An extreme ultraviolet light generating method for generating extreme ultraviolet light in a chamber, the extreme ultraviolet light generating method comprising:
    a pressure obtaining step of obtaining information on pressure in the chamber;
    a gas introducing step of introducing gas into the chamber;
    an exhausting step of exhausting the gas from the chamber; and
    a controlling step of switching between application and non-application of a voltage to a piezoelectric element provided in the chamber,
    the controlling step including determining whether or not to apply a voltage to the piezoelectric element provided in the chamber based on the information on the pressure in the chamber obtained in the pressure obtaining step.

15. An electronic device manufacturing method comprising:
- irradiating a target substance supplied into a chamber with a laser beam introduced into the chamber to generate plasma from which extreme ultraviolet light is generated, with an extreme ultraviolet light generating apparatus, the extreme ultraviolet light generating apparatus including
- the chamber,
- a piezoelectric element provided in the chamber,
- a pressure sensor configured to detect pressure in the chamber,
- a gas introducing unit configured to introduce gas into the chamber,
- an exhaust unit configured to exhaust the gas from the chamber, and
- a control unit configured to control application of a voltage to the piezoelectric element, the control unit being configured to determine whether or not to apply a voltage to the piezoelectric element based on information on the pressure in the chamber obtained by the pressure sensor;
- outputting the extreme ultraviolet light to an exposure apparatus; and
- exposing the extreme ultraviolet light onto a photosensitive substrate within the exposure apparatus.

* * * * *